US008409476B2

(12) United States Patent
Hsu et al.

(10) Patent No.: US 8,409,476 B2
(45) Date of Patent: *Apr. 2, 2013

(54) HIGH WORK FUNCTION TRANSPARENT CONDUCTORS

(75) Inventors: Che-Hsiung Hsu, Wilmington, DE (US); Hjalti Skulason, Buellton, CA (US)

(73) Assignee: E I du Pont de Nemours and Company, Wilmington, DE (US)

( * ) Notice: Subject to any disclaimer, the term of this patent is extended or adjusted under 35 U.S.C. 154(b) by 25 days.

This patent is subject to a terminal disclaimer.

(21) Appl. No.: 13/075,404

(22) Filed: Mar. 30, 2011

(65) Prior Publication Data
US 2011/0175039 A1 Jul. 21, 2011

Related U.S. Application Data

(62) Division of application No. 12/829,515, filed on Jul. 2, 2010, now abandoned, which is a division of application No. 11/476,979, filed on Jun. 28, 2006, now Pat. No. 7,749,407.

(60) Provisional application No. 60/694,793, filed on Jun. 28, 2005.

(51) Int. Cl.
*H01B 1/04* (2006.01)
*H01B 1/24* (2006.01)

(52) U.S. Cl. ............... 252/511; 252/510; 252/521.6; 252/500; 361/437; 977/784; 977/783; 977/788

(58) Field of Classification Search .............. 252/511, 252/510, 521.6, 500; 977/784, 783, 788; 361/437
See application file for complete search history.

(56) References Cited

U.S. PATENT DOCUMENTS

| | | |
|---|---|---|
| 3,282,875 A | 11/1966 | Connolly et al. |
| 4,321,114 A | 3/1982 | MacDiarmid et al. |
| 4,356,429 A | 10/1982 | Tang |
| 4,358,545 A | 11/1982 | Ezzell et al. |
| 4,433,082 A | 2/1984 | Grot |
| 4,442,187 A | 4/1984 | MacDiarmid et al. |
| 4,539,507 A | 9/1985 | VanSlyke et al. |
| 4,552,927 A | 11/1985 | Warren |
| 4,731,408 A | 3/1988 | Jasne |
| 4,795,543 A | 1/1989 | Stetter et al. |
| 4,869,979 A | 9/1989 | Ohtani et al. |
| 4,889,659 A | 12/1989 | Genies |
| 4,933,106 A | 6/1990 | Sakai et al. |
| 4,940,525 A | 7/1990 | Ezzell et al. |
| 4,959,430 A | 9/1990 | Jonas et al. |
| 4,973,391 A | 11/1990 | Madou et al. |
| 4,987,042 A | 1/1991 | Jonas et al. |
| 5,002,700 A | 3/1991 | Otagawa et al. |
| 5,035,926 A | 7/1991 | Jonas et al. |
| 5,066,731 A | 11/1991 | Feldhues et al. |
| 5,069,820 A | 12/1991 | Jen et al. |
| 5,115,057 A | 5/1992 | Ono et al. |
| 5,126,017 A | 6/1992 | Nakama et al. |
| 5,160,457 A | 11/1992 | Elsenbaumer et al. |
| 5,185,100 A | 2/1993 | Han et al. |
| 5,233,000 A | 8/1993 | Yodice et al. |
| 5,247,190 A | 9/1993 | Friend et al. |
| 5,258,461 A | 11/1993 | Facci et al. |
| 5,281,363 A | 1/1994 | Shacklette et al. |
| 5,286,413 A | 2/1994 | Hannecart et al. |
| 5,294,504 A | 3/1994 | Otagawa et al. |
| 5,300,575 A | 4/1994 | Jonas et al. |
| 5,312,681 A | 5/1994 | Muys |
| 5,317,169 A | 5/1994 | Nakano et al. |
| 5,354,613 A | 10/1994 | Quintens et al. |
| 5,370,981 A | 12/1994 | Krafft et al. |
| 5,372,924 A | 12/1994 | Quintens et al. |
| 5,378,402 A | 1/1995 | Cross et al. |
| 5,378,403 A | 1/1995 | Shacklette |
| 5,408,109 A | 4/1995 | Heeger et al. |
| 5,463,005 A | 10/1995 | Desmarteau |
| 5,489,400 A | 2/1996 | Liu et al. |
| 5,537,000 A | 7/1996 | Alivisatos et al. |
| 5,554,179 A | 9/1996 | Stroetmann et al. |
| 5,567,356 A | 10/1996 | Kinlen |
| 5,578,249 A | 11/1996 | Ohtani et al. |
| 5,585,038 A | 12/1996 | Kirmanen et al. |
| 5,705,888 A | 1/1998 | Staring et al. |
| 5,716,550 A | 2/1998 | Gardner et al. |
| 5,723,873 A | 3/1998 | Yang |
| 5,728,801 A | 3/1998 | Wu et al. |

(Continued)

FOREIGN PATENT DOCUMENTS

| CN | 1274869 A | 11/2000 |
|---|---|---|
| CN | 1276388 A | 12/2000 |

(Continued)

OTHER PUBLICATIONS

Written Opinion of the International Searching Authority, PCT/US06/25128, PCT Counterpart of the Present Application and Its Parent Application, Lee W. Young, Authorized Officer, United States Patent and Trademark Office As International Searching Authority, Dec. 28, 2007.

The Patent Office of the State Intellectual Property Office of the People's Republic of China, English Translation of First Office Action, Chinese Patent Application No. 200680022874.0, Chinese Counterpart of the Present Application, Date of Dispatch of Office Action Mar. 30, 2010.

(Continued)

*Primary Examiner* — Douglas McGinty

(57) ABSTRACT

There is provided a transparent conductor including conductive nanoparticles and at least one of (a) a fluorinated acid polymer and (b) a semiconductive polymer doped with a fluorinated acid polymer. The nanoparticles are carbon nanoparticles, metal nanoparticles, or combinations thereof. The carbon and metal nanoparticles are selected from nanotubes, fullerenes, and nanofibers. The acid polymers are fluorinated or highly fluorinated and have acidic groups including carboxylic acid groups, sulfonic acid groups, sulfonimide groups, phosphoric acid groups, phosphonic acid groups, and combinations thereof. The semiconductive polymers comprise homopolymers and copolymers derived from monomers selected from substituted and unsubstituted thiophenes, pyrroles, anilines, and cyclic heteroaromatics, and combinations of those. The compositions may be used in organic electronic devices (OLEDs).

11 Claims, 2 Drawing Sheets

U.S. PATENT DOCUMENTS

| | | | |
|---|---|---|---|
| 5,766,515 A | 6/1998 | Jonas et al. | |
| 5,773,150 A | 6/1998 | Tong et al. | |
| 5,792,830 A | 8/1998 | Noding et al. | |
| 5,798,170 A | 8/1998 | Zhang et al. | |
| 5,863,465 A | 1/1999 | Kinlen | |
| 5,869,350 A | 2/1999 | Heeger et al. | |
| 5,910,385 A | 6/1999 | Gardner et al. | |
| 5,917,279 A | 6/1999 | Elschner et al. | |
| 5,932,144 A | 8/1999 | Shimizu et al. | |
| 5,965,281 A | 10/1999 | Cao | |
| 5,986,400 A | 11/1999 | Staring et al. | |
| 5,994,496 A | 11/1999 | Van Haare et al. | |
| 6,004,483 A | 12/1999 | Jonas et al. | |
| 6,018,018 A | 1/2000 | Samuelson et al. | |
| 6,030,550 A | 2/2000 | Angelopoulos et al. | |
| 6,083,635 A | 7/2000 | Jonas et al. | |
| 6,097,147 A | 8/2000 | Baldo et al. | |
| 6,136,909 A | 10/2000 | Liao et al. | |
| 6,150,426 A | 11/2000 | Curtin et al. | |
| 6,197,418 B1 | 3/2001 | Cloots et al. | |
| 6,205,016 B1 | 3/2001 | Niu | |
| 6,210,790 B1 | 4/2001 | Crivello | |
| 6,225,040 B1 | 5/2001 | Muys et al. | |
| RE37,370 E | 9/2001 | Cao | |
| 6,303,238 B1 | 10/2001 | Thompson et al. | |
| 6,303,943 B1 | 10/2001 | Yu et al. | |
| 6,319,428 B1 * | 11/2001 | Michot et al. | 252/500 |
| 6,324,091 B1 | 11/2001 | Gryko et al. | |
| 6,337,370 B1 | 1/2002 | Bae et al. | |
| 6,340,496 B1 | 1/2002 | Cloots et al. | |
| 6,358,437 B1 | 3/2002 | Jonas et al. | |
| 6,376,105 B1 | 4/2002 | Jonas et al. | |
| 6,391,481 B1 | 5/2002 | Jonas et al. | |
| 6,452,711 B1 | 9/2002 | Heuer et al. | |
| 6,507,428 B1 | 1/2003 | Heuer et al. | |
| 6,515,314 B1 | 2/2003 | Duggal et al. | |
| 6,593,690 B1 | 7/2003 | McCormick et al. | |
| 6,611,096 B1 | 8/2003 | McCormick et al. | |
| 6,632,472 B2 | 10/2003 | Louwet et al. | |
| 6,670,645 B2 | 12/2003 | Grushin et al. | |
| 6,706,963 B2 * | 3/2004 | Gaudiana et al. | 136/263 |
| 6,717,358 B1 | 4/2004 | Liao et al. | |
| 6,756,474 B2 | 6/2004 | Hsu | |
| 6,830,828 B2 | 12/2004 | Thompson et al. | |
| 6,875,523 B2 | 4/2005 | Grushin et al. | |
| 6,923,881 B2 | 8/2005 | Tateishi et al. | |
| 6,924,047 B2 | 8/2005 | Radu et al. | |
| 6,963,005 B2 | 11/2005 | Lecloux et al. | |
| 6,967,236 B1 | 11/2005 | Angelopoulos et al. | |
| 7,112,369 B2 | 9/2006 | Wang et al. | |
| 7,166,010 B2 | 1/2007 | Lamansky et al. | |
| 7,189,771 B2 * | 3/2007 | Hsu | 524/165 |
| 7,202,369 B2 | 4/2007 | Baik et al. | |
| 7,211,202 B2 | 5/2007 | Korzhenko | |
| 7,211,824 B2 | 5/2007 | Lazarev | |
| 7,244,797 B2 | 7/2007 | Kurihara et al. | |
| 7,250,461 B2 * | 7/2007 | Hsu et al. | 524/445 |
| 7,307,276 B2 | 12/2007 | Andriessen | |
| 7,317,047 B2 * | 1/2008 | Hsu | 524/165 |
| 7,318,982 B2 | 1/2008 | Gozdz et al. | |
| 7,338,620 B2 * | 3/2008 | Hsu et al. | 252/500 |
| 7,341,801 B2 | 3/2008 | Reuter et al. | |
| 7,351,358 B2 | 4/2008 | Hsu et al. | |
| 7,354,532 B2 * | 4/2008 | Hsu et al. | 252/511 |
| 7,371,336 B2 | 5/2008 | Hsu et al. | |
| 7,390,438 B2 * | 6/2008 | Hsu et al. | 252/500 |
| 7,431,866 B2 * | 10/2008 | Hsu et al. | 252/500 |
| 7,455,793 B2 * | 11/2008 | Hsu et al. | 252/500 |
| 7,462,298 B2 | 12/2008 | Hsu et al. | |
| 7,569,158 B2 | 8/2009 | Waller et al. | |
| 7,593,004 B2 | 9/2009 | Spath et al. | |
| 7,727,421 B2 | 6/2010 | Hsu et al. | |
| 7,749,407 B2 * | 7/2010 | Hsu et al. | 252/511 |
| 7,837,901 B2 | 11/2010 | Hsu et al. | |
| 8,088,499 B1 | 1/2012 | Wang | |
| 2001/0019782 A1 | 9/2001 | Igarashi et al. | |
| 2001/0038937 A1 | 11/2001 | Suzuki et al. | |
| 2002/0009680 A1 | 1/2002 | Majumdar et al. | |
| 2002/0017612 A1 | 2/2002 | Yu et al. | |
| 2002/0038999 A1 | 4/2002 | Cao et al. | |
| 2002/0041151 A1 | 4/2002 | Park et al. | |
| 2002/0098377 A1 | 7/2002 | Cao et al. | |
| 2002/0099119 A1 | 7/2002 | Craig | |
| 2002/0127381 A1 | 9/2002 | Will et al. | |
| 2002/0132164 A1 | 9/2002 | Kaneko et al. | |
| 2002/0136923 A1 | 9/2002 | Jonas et al. | |
| 2002/0190250 A1 | 12/2002 | Grushin et al. | |
| 2002/0192476 A1 | 12/2002 | Kambe et al. | |
| 2003/0020073 A1 | 1/2003 | Long et al. | |
| 2003/0108771 A1 | 6/2003 | Lecloux et al. | |
| 2003/0118829 A1 * | 6/2003 | Hsu | 428/411.1 |
| 2003/0146436 A1 | 8/2003 | Parker et al. | |
| 2003/0176628 A1 | 9/2003 | Groenendaal | |
| 2003/0213952 A1 | 11/2003 | Iechi et al. | |
| 2004/0009346 A1 * | 1/2004 | Jang et al. | 428/336 |
| 2004/0010115 A1 | 1/2004 | Sotzing | |
| 2004/0036067 A1 | 2/2004 | Andriessen | |
| 2004/0072987 A1 | 4/2004 | Groenendaal et al. | |
| 2004/0092700 A1 | 5/2004 | Hsu | |
| 2004/0097741 A1 | 5/2004 | Groenendaal et al. | |
| 2004/0102577 A1 * | 5/2004 | Hsu et al. | 525/182 |
| 2004/0124504 A1 | 7/2004 | Hsu | |
| 2004/0127637 A1 | 7/2004 | Hsu et al. | |
| 2004/0147765 A1 | 7/2004 | Baik et al. | |
| 2004/0149952 A1 * | 8/2004 | DePenning et al. | 251/305 |
| 2004/0149962 A1 | 8/2004 | Andriessen | |
| 2004/0181011 A1 | 9/2004 | Korzhenko et al. | |
| 2004/0206942 A1 * | 10/2004 | Hsu | 252/500 |
| 2004/0214985 A1 | 10/2004 | Martin et al. | |
| 2004/0217877 A1 | 11/2004 | Kokonaski et al. | |
| 2004/0222413 A1 | 11/2004 | Hsu et al. | |
| 2004/0254297 A1 * | 12/2004 | Hsu et al. | 525/54.2 |
| 2004/0262599 A1 | 12/2004 | Bernds et al. | |
| 2005/0040374 A1 * | 2/2005 | Chittibabu et al. | 252/501.1 |
| 2005/0069726 A1 | 3/2005 | Douglas | |
| 2005/0070654 A1 * | 3/2005 | Hsu | 524/430 |
| 2005/0089679 A1 | 4/2005 | Ittel et al. | |
| 2005/0124784 A1 | 6/2005 | Sotzing | |
| 2005/0184287 A1 | 8/2005 | Herron et al. | |
| 2005/0205860 A1 * | 9/2005 | Hsu et al. | 257/40 |
| 2005/0208328 A1 * | 9/2005 | Hsu et al. | 428/690 |
| 2005/0209388 A1 * | 9/2005 | Hsu et al. | 524/457 |
| 2005/0209392 A1 | 9/2005 | Luo et al. | |
| 2005/0222333 A1 * | 10/2005 | Hsu | 525/178 |
| 2005/0224765 A1 | 10/2005 | Hsu et al. | |
| 2005/0224788 A1 * | 10/2005 | Hsu et al. | 257/40 |
| 2005/0272214 A1 | 12/2005 | Chiang et al. | |
| 2006/0051401 A1 | 3/2006 | Manohar | |
| 2006/0076050 A1 | 4/2006 | Williams et al. | |
| 2006/0076557 A1 | 4/2006 | Waller et al. | |
| 2006/0076577 A1 | 4/2006 | Boos et al. | |
| 2006/0113510 A1 * | 6/2006 | Luo et al. | 252/500 |
| 2006/0180810 A1 | 8/2006 | Lee et al. | |
| 2006/0202171 A1 | 9/2006 | Yoshida et al. | |
| 2006/0274049 A1 | 12/2006 | Spath et al. | |
| 2006/0289843 A1 * | 12/2006 | Hsu et al. | 252/518.1 |
| 2006/0292362 A1 * | 12/2006 | Hsu et al. | 428/323 |
| 2007/0045591 A1 | 3/2007 | Hsu et al. | |
| 2007/0069184 A1 | 3/2007 | Hsu et al. | |
| 2007/0069185 A1 | 3/2007 | Hsu | |
| 2007/0096082 A1 | 5/2007 | Gaynor et al. | |
| 2008/0128662 A1 | 6/2008 | Hsu et al. | |
| 2008/0135809 A1 * | 6/2008 | Hsu | 252/500 |
| 2008/0210910 A1 | 9/2008 | Hsu et al. | |
| 2008/0213594 A1 * | 9/2008 | Hsu | 428/411.1 |
| 2008/0248314 A1 * | 10/2008 | Hsu et al. | 428/419 |
| 2008/0251768 A1 * | 10/2008 | Hsu et al. | 252/500 |
| 2008/0258605 A1 | 10/2008 | Yukinobu | |
| 2008/0283800 A1 * | 11/2008 | Hsu | 252/511 |
| 2008/0296536 A1 * | 12/2008 | Hsu et al. | 252/500 |
| 2009/0008609 A1 * | 1/2009 | Yeisley et al. | 252/500 |
| 2009/0072201 A1 | 3/2009 | Hsu et al. | |
| 2009/0114884 A1 | 5/2009 | Hsu | |
| 2009/0154059 A1 | 6/2009 | Wessling et al. | |
| 2009/0318710 A1 | 12/2009 | Brassat et al. | |

FOREIGN PATENT DOCUMENTS

| | | | |
|---|---|---|---|
| CN | 1439029 A | 8/2003 |
| DE | 2029556 A1 | 12/1971 |
| DE | 3938094 A1 | 5/1991 |
| DE | 4211459 A1 | 10/1993 |
| DE | 4334390 A1 | 4/1995 |
| DE | 10018750 A1 | 1/2001 |
| DE | 102004006583 A1 | 9/2005 |
| DE | 102004010811 A1 | 9/2005 |
| EP | 245987 A2 | 10/1991 |
| EP | 560721 A2 | 9/1993 |
| EP | 356239 A2 | 2/1995 |
| EP | 517379 A1 | 6/1995 |
| EP | 361322 A2 | 11/1995 |
| EP | 440957 A2 | 3/1996 |
| EP | 488321 A1 | 10/1997 |
| EP | 817540 A2 | 1/1998 |
| EP | 828184 A1 | 3/1998 |
| EP | 593111 A1 | 6/1998 |
| EP | 1079397 A1 | 2/2001 |
| EP | 761691 A2 | 1/2002 |
| EP | 1191612 A2 | 3/2002 |
| EP | 1191614 A2 | 3/2002 |
| EP | 1227529 A2 | 7/2002 |
| EP | 1231251 A1 | 8/2002 |
| EP | 1286569 A1 | 2/2003 |
| EP | 1054414 A1 | 3/2003 |
| EP | 1061530 A1 | 3/2003 |
| EP | 962943 A1 | 12/2003 |
| EP | 1371709 A1 | 12/2003 |
| EP | 1384739 A1 | 1/2004 |
| EP | 1408563 A2 | 4/2004 |
| EP | 949283 A1 | 4/2005 |
| EP | 949308 A1 | 4/2005 |
| EP | 1546237 A2 | 6/2005 |
| EP | 1564250 A1 | 8/2005 |
| EP | 1564251 A1 | 8/2005 |
| EP | 1615971 A2 | 1/2006 |
| EP | 1 026 152 B1 | 7/2006 |
| EP | 1726051 A1 | 11/2006 |
| EP | 1730212 A1 | 12/2006 |
| FR | 2632979 A1 | 12/1989 |
| GB | 2124635 A | 2/1984 |
| JP | 62119237 A | 5/1987 |
| JP | 62138582 A | 6/1987 |
| JP | 62164717 A | 7/1987 |
| JP | 63135453 A | 6/1988 |
| JP | 63215772 A | 9/1988 |
| JP | 02160823 A | 6/1990 |
| JP | 02209931 A | 8/1990 |
| JP | 02249221 A | 10/1990 |
| JP | 04234453 A | 8/1992 |
| JP | 05129162 A | 5/1993 |
| JP | 05255576 A | 10/1993 |
| JP | 05262981 A | 10/1993 |
| JP | 06073271 A | 3/1994 |
| JP | 06264024 A | 9/1994 |
| JP | 06306280 A | 11/1994 |
| JP | 06313038 A | 11/1994 |
| JP | 07010973 A | 1/1995 |
| JP | 07090060 A | 4/1995 |
| JP | 07157549 A | 6/1995 |
| JP | 07165892 A | 6/1995 |
| JP | 08048850 A | 2/1996 |
| JP | 08048858 A | 2/1996 |
| JP | 09176310 A | 7/1997 |
| JP | 10261418 A | 9/1998 |
| JP | 10509751 A | 9/1998 |
| JP | 11186103 A | 7/1999 |
| JP | 11353934 A | 12/1999 |
| JP | 2000091081 A | 3/2000 |
| JP | 2000505249 A | 4/2000 |
| JP | 2000336154 A | 12/2000 |
| JP | 2001006878 A | 1/2001 |
| JP | 2001035276 A | 2/2001 |
| JP | 2001106782 A | 4/2001 |
| JP | 2001270999 A | 10/2001 |
| JP | 2001325831 A | 11/2001 |
| JP | 2002500408 A | 1/2002 |
| JP | 2002082082 A | 3/2002 |
| JP | 2002246177 A | 8/2002 |
| JP | 2003040856 A | 2/2003 |
| JP | 2003187983 A | 7/2003 |
| JP | 2003217862 A | 7/2003 |
| JP | 2003261749 A | 9/2003 |
| JP | 2003264083 A | 9/2003 |
| JP | 2003297582 A | 10/2003 |
| JP | 2003301116 A | 10/2003 |
| JP | 2004500449 T | 1/2004 |
| JP | 2004501494 T | 1/2004 |
| JP | 2004502004 A | 1/2004 |
| JP | 2004082395 A | 3/2004 |
| JP | 2004107552 A | 4/2004 |
| JP | 2004231939 A | 8/2004 |
| JP | 2004523623 A | 8/2004 |
| JP | 2004532307 A | 10/2004 |
| JP | 2005500196 | 12/2004 |
| JP | 2005108504 A | 4/2005 |
| JP | 2005120363 A | 5/2005 |
| JP | 2005232452 A | 9/2005 |
| JP | 2005536595 A | 12/2005 |
| JP | 2005537348 A | 12/2005 |
| JP | 2006500461 A | 1/2006 |
| JP | 2006500463 A | 1/2006 |
| JP | 2006502254 A | 1/2006 |
| JP | 2006108064 A | 4/2006 |
| JP | 2006527277 A | 11/2006 |
| JP | 2007502531 A | 2/2007 |
| JP | 2007529607 A | 10/2007 |
| JP | 2009270117 A | 11/2009 |
| KR | 100613311 B1 | 8/2006 |
| RU | 2035803 C1 | 5/1995 |
| TW | 463524 B | 11/2001 |
| TW | 505927 B | 10/2002 |
| TW | I327152 | 7/2010 |
| WO | 9305519 A1 | 3/1993 |
| WO | 9614643 A1 | 11/1994 |
| WO | 9801909 A1 | 1/1998 |
| WO | WO 98/31716 A1 | 7/1998 |
| WO | 9934371 A1 | 7/1999 |
| WO | WO 99/52954 A1 | 10/1999 |
| WO | WO 00/70655 A2 | 11/2000 |
| WO | 0138219 A1 | 5/2001 |
| WO | 0141230 A1 | 6/2001 |
| WO | WO 01/41512 A1 | 6/2001 |
| WO | 0199192 A2 | 12/2001 |
| WO | 0199207 A2 | 12/2001 |
| WO | 0200759 A1 | 1/2002 |
| WO | 0202714 A2 | 1/2002 |
| WO | 0205354 A1 | 1/2002 |
| WO | 0215645 A1 | 2/2002 |
| WO | 0242352 A2 | 5/2002 |
| WO | 02065484 A1 | 8/2002 |
| WO | 02079316 A2 | 10/2002 |
| WO | 02080627 A2 | 10/2002 |
| WO | 02099907 A1 | 12/2002 |
| WO | 03006515 A1 | 1/2003 |
| WO | WO 03/006537 A1 | 1/2003 |
| WO | WO 03/008424 A1 | 1/2003 |
| WO | 03012908 A2 | 2/2003 |
| WO | WO 03/040257 A1 | 5/2003 |
| WO | 03046540 A1 | 6/2003 |
| WO | 03048228 A1 | 6/2003 |
| WO | 03050824 A1 | 6/2003 |
| WO | WO 03/063555 A1 | 7/2003 |
| WO | 03074601 A2 | 9/2003 |
| WO | WO 03/091688 A2 | 11/2003 |
| WO | WO 2004/016710 A1 | 2/2004 |
| WO | 2004018544 A1 | 3/2004 |
| WO | 2004019345 A1 | 3/2004 |
| WO | 2004020444 A1 | 3/2004 |
| WO | 2004020502 A1 | 3/2004 |
| WO | 2004029128 A2 | 4/2004 |
| WO | 2004029133 A1 | 4/2004 |
| WO | 2004029176 A1 | 4/2004 |
| WO | 2004031192 A1 | 4/2004 |
| WO | WO 2004029133 A1 | 4/2004 |
| WO | 2004094501 A2 | 11/2004 |

| | | | |
|---|---|---|---|
| WO | WO 2004094501 A2 | 11/2004 | |
| WO | 2004105150 A1 | 12/2004 | |
| WO | 2004106404 A1 | 12/2004 | |
| WO | 2005003083 A1 | 1/2005 | |
| WO | 2005018012 A1 | 2/2005 | |
| WO | 2005024853 A1 | 3/2005 | |
| WO | 2005041217 A1 | 5/2005 | |
| WO | 2005052027 A1 | 6/2005 | |
| WO | 2005080525 A2 | 9/2005 | |
| WO | 2005090435 A1 | 9/2005 | |
| WO | 2005090436 A1 | 9/2005 | |
| WO | 2005093872 A1 | 10/2005 | |
| WO | 2005121217 A1 | 12/2005 | |
| WO | 2006073968 A2 | 7/2006 | |
| WO | 2006078264 A2 | 7/2006 | |
| WO | 2007002681 A2 | 1/2007 | |
| WO | 2007002740 A2 | 1/2007 | |
| WO | 2007092296 A2 | 8/2007 | |
| WO | 2007120143 A1 | 10/2007 | |

OTHER PUBLICATIONS

U.S. Appl. No. 60/105,662, filed Oct. 25, 1999, Zhen Yu Yang et al.
U.S. Appl. No. 60/176,881, filed Jan. 19, 2000, Jose M. Rodriguez-Parada.
Wu et. al., Transparent, Conductive Carson Nanotube Films, Science, 2004, vol. 305:1273-1276.
Journet et. al. Large-Scale Production of Single-Walled Carbon Nanotubes by the Electric-Arc Technique, Nature, 1997, vol. 388:756-758.
Thess et. al., Crystalline Ropes of Metallic Carbon Nanotubes, Science, 1996, vol. 273:483-487.
Ivanov et. al., The Study of Carbon Nanotubules Produced by Catalytic Method, Chem. Phys. Lett., 1994, vol. 223:329-335.
Li et. al., Large-Scale Synthesis of Aligned Carbon Nanotubes, Science, 1996, vol. 274:1701-1703.
Lee et. al., Macromolecules, Poly(thieno{3,4-b}thiophene), A New Stable Low Band Gap Conducting Polymer, 2001, vol. 34:5746-5747.
Sotzing et. al., Macromolecules, Poly(thieno{3,4-b}thiophene): A p- and n-DOPABLE Polythiophene Exhibiting High Optical Transparency in the Semiconducting State, 2002, vol. 35:7281-7286.
Feiring et. al., Novel Aromatic Polymers With Pendant Lithium Perfluoroalkylsulfonate or Sulfonimide Groups, Macromolecules, 2000, vol. 33:9262-9271.
D. Desmarteau, Novel Perfluorinated Ionomers and Ionenes, J. Fluorine Chem., 1995, vol. 72:203-208.
J. Appleby et. al., Polymeric Perfluoro Bis-Sulfonimides As Possible Fuel Cells Electrolytes, J. Electrochem. Soc., 1993, vol. 140:109-111.
CRC Handbook of Chemistry and Physics, 81$^{st}$ Edition, 2000 (Book Not Included).
Schroedner et al., "Organische Feldeffekttransistoren auf Basis Halbleitender Polymere/Organic Field-Effect Transistors Based on Semiconducting Polymers," Elektrotechnik and Informationstechnik, Springer Verlag, 2003, vol. 120, No. 6, pp. 205-209 (English translation also submitted).
Schwendeman et al; Perfluoroalkanoate-substituted PEDOT for Electronic Device Applications, Advanced Functional Materials, vol. 13, No. 7, 2003, pp. 541-547.
Segura, J.L., et al., "Synthesis and Electropolymerization of a Perylenebisimide-Functionalized 3, 4-Ethylenedioxythiophene Derivative," Organic Letters, vol. 7, No. 12, 2005, pp. 2345-2348.
Sharpe et al., "Improved Cationic Conductive Polymer," Calgon Corp., Coating Conference (Proceeding) 1981, pp. 83-87.
Simpson et al.—Advances and Applications of Inherently Conductive Polymer Technologies Based on Poly(3,4-Ethylenedioxythiophene) 2005 AIMCAL Fall Technical Conference.
Stejskal et al., "Polyaniline Dispersions 10. Coloured Microparticles of Variable Density Prepared Using Stabilizer Mixtures," Colloid Polymer Science, vol. 278, 2000, pp. 654-658.
Sun et al, "Catalytic Oxidation Polymerization of Aniline in an H2O2-Fe2+ System," Journal of Applied Polymer Science, 1999, vol. 72, pp. 1077-1084.

Tang et al., "Organic/Inorganic Material for Coating on Metals," Materials Research Society Symp. Proc., vol. 734, 2003, pp. B.9.57.1-7.
Thelakkat et al., "Poly(triarylamine)s-Synthesis and Application in Electroluminescent Devices and Photovoltaics," Synthetic Metals, 1999, vol. 102, pp. 1125-1128.
Unknown, The Experimental Chemistry Course, 4th Ed., vol. 20, Organic Synthesis II--Alcohol and Amines, 1992, pp. 49-51 (Japanese Only).
Venturello, C. et al., "A Convenient Catalytic Method for the Dihydroxylation of Alkenes by Hydrogen Peroxide," Synthesis, 1989, 4, 295-297.
Wang—Photoconductive Materials, Kirk-Othmer Encyclopedia of Chemical Technology, Fourth Edition, 1996, vol. 18 pp. 837-860.
Yang S-M et al: "The photoelectrochemical properties of TiO2 electrodes modified by quantum sized PbS and thiols", Synthetic Metals, vol. 123, No. 2, Sep. 4, 2001, pp. 267-272.
Yuan Y F et al: "Size and morphology effects of ZnO anode nanomaterials for Zn/Ni secondary batteries; Size and morphology effects of ZnO anode nanomaterials for Zn/Ni secondary batteries", Nanotechnology, vol. 16, No. 6, Jun. 1, 2005, pp. 803-808.
Decision 19931229; Case No. T0860/93; Application No. 88115147.6 [Cited in EP 1546237 Opposition].
Decision 19971120; Case No. T1078/93-3.3.5; Application No. 90905154.2; Publication No. 0462216; Process for Improving the Physical and Catalytic Properties of a Fluid Cracking Catalyst [Cited in EP 1546237 Opposition].
Decision 20020117; Case No. T0939/98-3.3.3; Application No. 95910871.3; Publication No. 0742800; Two-phase Acidic Aqueous Compositions for Diffusion Transfer Products [Cited in EP 1546237 Opposition].
Decision 20080729; Case No. T0114/06-3.3.02; Application No. 04013422.3; Publication No. 1452171; Pharmaceutical Liquid Suspensions [Cited in EP 1546237 Opposition].
Extended European Search Report for Application No. Ep 06785720.0; Jun. 30, 2009.
Extended European Search Report for Application No. EP 10005557.3, Dec. 1, 2010.
Extended European Search Report for Application No. EP10 01 2649; Rafael Kiebooms, Mar. 1, 2011.
Extended European Search Report for Application No. EP 10 01 1570; May 17, 2011.
EPO Official Action for Application No. 03770524.1; Feb. 25, 2010.
EPO Official Action for Application No. 05725618.2; May 31, 2011.
EPO Official Letter regarding Application No. EP 05736268.3; Nov. 11, 2008.
PCT International Search Report for PCT/US2003/030509; C. Meiners Authorized Officer; Feb. 17, 2004.
PCT International Search Report for PCT/US2003/030512; R. Kiebooms Authorized Officer, Feb. 19, 2004.
PCT International Search Report for International Application No. PCT/US2003/030026; R. Kiebooms Authorized Officer, Mar. 24, 2004.
PCT International Search Report for PCT/US2005/008563; R. Kiebooms Authorized Officer; Jun. 17, 2005.
PCT International Search Report for PCT/US2005/008561; G. Wolfbauer Authorized Officer; Jun. 30, 2005.
PCT International Search Report for Application No. PCT/US2005/012461; C. Meiners Authorized Officer; Jul. 29, 2005.
PCT International Search Report for International Application No. PCT/US2005/008763; F. Rousseau, Authorized Officer; Aug. 3, 2005.
Opposition Against EP 1 546 237 B1, H. C. Starck Clevios GmbH, Goslar, Germany, May 13, 2009 (German Original).
Opposition Against EP 1 546 237 B1, H. C. Starck Clevios GmbH, Goslar, Germany, May 13, 2009 (English Translation).
Opposition Against EP 1 546 237 B1, E. I. du Pont de Nemours and Company, Wilmington, Delaware, Observations of the Patent Proprietor, Mar. 1, 2010.
Opposition Against EP 1 546 237 B1, E. I. du Pont de Nemours and Company, Wilmington, Delaware, Observations of the Patent Proprietor, Mar. 1, 2010, Annex, Declaration of Dr Hjalti Skulason dated Feb. 24, 2010.

Opposition Against EP 1 546 237 B1, E. I. du Pont de Nemours and Company, Wilmington, Delaware, Observations of the Patent Proprietor, Mar. 1, 2010, Annex, Experimental Data, Sep. 21-Oct. 6, 2009.
Opposition Against EP 1 546 237; Decision Revoking European Patent; EPO Opposition Division; Dec. 8, 2011.
"DuPont Fuel Cells--DuPont Nafion PFSA Membranes NE-1135, N-115, N-117, Ne-1110," Jan. 1, 2005, pp. 1-4.
Aldrich Catalog, Germany; 1994-95; p. 1137; as evidence of product with catalog No. 27,740-4.
Aleshin et al., "Transport Properties of Poly(3,4-ethylenedioxythiophene)/poly(styrenesulfonate)," Synthetic Metals, 1998, vol. 94, pp. 173-177.
Arnautov et al., New Dopant-Solvent System for Conductive PAN Films Production, Synthetic Metals, 1997, vol. 84, No. 1-3, pp. 133-134, Elsevier Science S.A.
Baytron Coating Guide Issue Oct. 2002—Obtained From www.hcstarck-echemicals.com.
Baytron H. C. Stark Gmbh (Brochure) No Date.
Baytron P VAP A1 4083 and Baytron P VP CH 8000 Product Information for Electronic Grades Designed for Use As Hole-Injection Material in Oleds—Obtained From www.hcstarckechemicals.com.
Baytron Product info from baytron.com; Aug. 1, 2007.
Bharathan et al., "Polymer/metal Interfaces and the Performance of Polymer Light-Emitting Diodes," Journal of Applied Physics, 1998, vol. 84(6), pp. 3207-3211.
Brown et al, "Built-in field electroabsorbtion spectroscopy of plymer light-emitting diodes incorporating a doped poly (3,4-ethylene dioxythiophene) hole injection layer," Applied Physics Letters, AIP, American Institute of Physics, vol. 75, No. 12, Sep. 20, 1999, pp. 1679-1681.
Campbell, I.H. et al., "Excitation Transfer Processes in a Phosphor-Doped Poly 9p-phenylene vinylene) Light-Emitting Diode," Physical Review B., vol. 65, 085210-1-085210-8.
Caras-Quintero et al., "Efficient Synthesis of 3,4-ethylenedioxythiophenes by Mitsunobu Reaction" Chemical Communications, Chemcom, Royal Society of Chemistry, GB, vol. 22, Nov. 4, 2002, pp. 2690-2691.
Caras-Quintero et al., "Synthesis of the First Enantiomerically Pure and Chiral, Disubstituted 3,4-ethylenedioxythiophenes (EDOTs) and Corresponding Stereo- and Regioregular PEDOTs," Chemical Communication, 2004, pp. 926-927.
Cassel et al., "Original Synthesis of Linear, Branched and Cyclic Oligoglycerol Standards," European Journal of Organic Chemistry, 2001, No. 5, pp. 875-896.
Cen et al., 1,1,2,2-Tetrafluoro-2-(polyfluoroalkoxy)ethanesulfonic Acids, 1,1,2,2-Tetrafluoro-2-(perfluoroalkoxy) ethanesulfonic Acids, and 2,2'-Oxybis(1,1,2,2-tetrafluoroethanesulfonic acid), Inorganic Chemistry, 1988, vol. 27, pp. 1376-1377, American Chemical Society.
Colvin et al., Light-Emitting Diodes Made from Cadmium Selenide Nanocrystals and a Semiconducting Polymer, Nature, 1994, vol. 370, pp. 354-357.
Conductive Polymer, Definition from Wikipedia, The Free Encyclopedia.
Downs et al., "Efficient Polymerization of Aniline at Carbon Nanotube Electrodes", Advanced Materials, 1999, vol. 11, No. 12, pp. 1028-1031.
England et al; "Nucleophilic Reactions of Fluoro-olefins," Journal of American Chemical Society (1960) v. 82, p. 5116.
Feiring et al., "Aromatic Monomers with Pendant Fluoroalkylsulfonate and Sulfonimide Groups," Journal of Fluorine Chemistry, 2000, vol. 105, pp. 129-135.
Fowler et al., "Hydrogen detection by Polyaniline nanofibers on gold and platinum electrodes", Journal of Physical Chemistry C, 2001, vol. 113, No. 16, pp. 6444-6449.
Gao, J. et al., "Soluble polypyrrole as the transparent anode in polymer light-emitting diodes," Synthetic Metals, 1996, 221-223, 82, Elsevier Science S.A.
Groenendaal et al, "Poly(3,4-ehtylenedioxythiophene) and Its Derivatives: Past, Present, and Future," Advanced Materials, 2000, vol. 12, No. 7, pp. 481-494.
Gustafsson et al., "Flexible Light-Emitting Diodes Made from Soluble Conducting Polymers," Nature, 1992, vol. 357, pp. 477-479.
Hackley et al., The Use of Nomenclature in Dispersion Science and Technology, NIST, Aug. 2001, pp. 2-4, 10, 11.
Hirai et al; "Electrochemical Behaviors of Polypyrrole, Poly-3-Methyl-thiophene, and Polyaniline Deposited on Nafion-Coated Electrodes," Journal of the Electrochemical Society, vol. 135, No. 5, May 1, 1988, pp. 1132-1137, Electrochemical Society, Manchester, NH.
Hong et al, "Association of Nafion with Polypyrrole Nanoparticles in a Hydrophilic Polymer Network: Effects on Proton Transport," Journal of Colloid and Interface Science, vol. 218 pp. 233-242; 1999-1001.
Hsu, C.-H., "Novel Preparation and Properties of Conductive Polyaniline/Nafion® Film," Synthetic Metals, 1991, vol. 41-43, pp. 671-674.
Huang et al., "Well-Dispersed Single-Walled Carbon Nanotube/Polyaniline Composite Films," Carbon, vol. 41, 2003, pp. 2731-2736.
Iijima et al., Single-Shell Carbon Nanotubes of 1-nm Diameter, Nature, 1993, vol. 363, pp. 603-605.
Jiang et al., "Preparation of a Nation Composite Membrane using a Porous Teflon Support," Journal of Membrane Science, Elsevier Scientific Publ. Co., Amsterdam, NL, vol. 132, No. 2, Sep. 3, 1997, pp. 273-276.
Kim et al., "Enhancement of Electrical Conductivity of Poly(3,4-ethylenedioxythiophene)/Poly(4-styrenesulfonate) by a Change of Solvents," Synthetic Metals, Elsevier Sequoia, vol. 126, No. 2/3, pp. 311-316, Feb. 2002.
Kitani et al; "Properties of Elastic Polyaniline," Synthetic Metals, vol. 84, No. 1-3, 1997, pp. 83-84, Elsevier Science S.A.
Laha, S.C. et al., "Highly Selective Epoxidation of Olefinic Compounds Over TS-1 and TS-2 Redox Molecular Sieves using Anhydrous Urea-Hydrogen Peroxide as Oxidizing Agent," Journal of Catalysis, 2002, vol. 208(2), pp. 339-344.
Lefebvre et al., "Chemical Synthesis, Characterization, and Electrochemical Studies of Poly(3,4-ethylenedioxythiophene)/Poly(styrene-4-sulfonate) Composites," Chem. Mater., 1999, 262-268, 11, American Chemical Society.
Levi et al., Polymer and Cathode Emission Studies of Polymer-Based Light-Emitting Diodes Under Strong Electrical Pulse Excitation, Journal of Applied Physics, 2000, vol. 88, No. 5, pp. 2548-2552.
Lewis, Hawley's Condensed Chemical Dictionary, 12th Ed., 1993, pp. 300-301.
Lim et al, "Degradation of Organic Light-Emitting Devices Due to Formation and Growth of Dark Spots," Materials Science and Engineering, 2001, pp. 154-159.
Lima, A., "Electropolymerization of and 3,4-ethylenedioxtyiophene and 3,4-Ethylenedioxythiophene Methanol in the Persence of Dodecylbenezenesulfonate," Synthetic Metals, 1998, 93, 33-41.
Madler et al., "Visibly Transparent and Radiopaque Inorganic Organic Composites from Flame-Made Mixed-Oxide Fillers," Journal of Nanoparticle Research, 2005, vol. 8, No. 3-4, pp. 323-333.
Moeller et al., "A Polymer/Semiconductor Write-Once Read-Many-Times Memory," Nature, 2003, vol. 426, pp. 166-169.
Morrison & Boyd, Organic Chemistry, 6th Ed., 1994, pp. 312-317 (First Half).
Nafion Definition; Wikipedia; May 13, 2009 (German).
Nafion Definition; Wikipedia; Feb. 18, 2010 (English).
O'Brien, D.F. et al., "Electrophosphorescence From a Doped Polymer Light Emitting Diode," Synthetic Metals, 2001, 116(1-3), 379-383.
Pickup et al., "Electronically conducting cation-exchange polymer powders: synthesis, characterization and applications in PEM fuel cells and supercapacitors," Journal of New Materials for Electrochemical Systems, vol. 3, 2000, pp. 21-26.
Qi, Zhigang et al., "Size Control of Polypyrrole Particles," Chem. Mater., American Chemical Society, 1997, vol. 9, pp. 2934-2939.
Riedel et al., Tailored Highly Transparent Composite Hole-Injection Layer Consisting of PETOT: PSS and SiO2 Nanoparticles for Efficient Polymer Light-Emitting Diodes, Advanced Materials, 2011 vol. 23, pp. 740-745.
Römpp Chemistry Dictionary, 9th Edition, 1993 (English translation also submitted).

Schottland P. et al., "Synthesis and Polymerization of New Monomers Derived From 3, 4-Ethylenedioxythiophene" Journal De Chimie Physique, Societe De Chimie Physique, Paris, Fr. vol. 95, No. 6, Jan. 1, 1998, pp. 1258-1261.

Opposition Against EP 1726051, Opposition Document from Herzog Fiesser & Partner; Heraeus Precious Metals GmbH; Sep. 15, 2011 [German].

Opposition Against EP 1726051, Opposition Document from Herzog Fiesser & Partner; Heraeus Precious Metals GmbH; Sep. 15, 2011 [English Translation].

Opposition Against EP 1726051; Observations of the Patentee; May 31, 2012.

Opposition Against EP 1726051; (E6) Experimental Data: PEDOT; May 31, 2012.

Opposition Against EP 1726051; Main Request—Claims; May 31, 2012.

Opposition Against EP 1726051; First Auxiliary Request—Claims; May 31, 2012.

Opposition Against EP 1726051; Second Auxiliary Request—Claims; May 31, 2012.

Opposition Against EP 1726051; Third Auxiliary Request—Claims; May 31, 2012.

Opposition Against EP 1726051; Fourth Auxiliary Request—Claims; May 31, 2012.

Opposition Against EP 1726051; Fifth Auxiliary Request—Claims; May 31, 2012.

Opposition Against EP 1726051; Sixth Auxiliary Request—Claims; May 31, 2012.

Opposition Against EP 1726051; Seventh Auxiliary Request—Claims; May 31, 2012.

Opposition Against EP 1726051; Eighth Auxiliary Request—Claims; May 31, 2012.

Opposition Against EP 1726051; Ninth Auxiliary Request—Claims; May 31, 2012.

Opposition Against EP 1726051; Tenth Auxiliary Request—Claims; May 31, 2012.

Opposition Against EP 1726051; Eleventh Auxiliary Request—Claims; May 31, 2012.

Opposition against EP 1726051; (E9) Experimental Data: Polypyrrole/Nafion; Jul. 2, 2012

Opposition Against EP 1546237; Patentee's Grounds for Appeal; Apr. 18, 2012.

"Dispersion Chemistry", Wikipedia entry, Nov. 4, 2012.

"Colloid," Wikipedia entry, Nov. 4, 2012.

Marrion, "Binders for Waterborne Coatings," The Chemistry and Physics of Coatings, Second Edition, 2004.

"Colloid," Definition from IUPAC Gold Book, Apr. 17, 2012.

Opposition Against EP 1546237; Declaration of Hjalti Skulason; Apr. 30, 2012.

ASTM, Standard Practice for Testing the Shelf Life of Ink Jet Printer Cartridges.

Opposition Against EP 1546237: Proposed Main Request—Claims; Apr. 18, 2012.

Opposition Against EP 1546237: First Auxiliary Request—Claims; Apr. 18, 2012.

Opposition Against EP 1546237: Second Auxiliary Request—Claims; Apr. 18, 2012.

Opposition Against EP 1546237: Third Auxiliary Request—Claims; Apr. 18, 2012.

Opposition Against EP 1546237: Fourth Auxiliary Request—Claims; Apr. 18, 2012.

Opposition Against EP 1546237: Fifth Auxiliary Request—Claims; Apr. 18, 2012.

U.S. Appl. No. 10/803,114 (Listed above as Issued US Patent 7,250,461; Jul. 31, 2007; not submitted separately).

U.S. Appl. No. 10/804,503 (Listed above as Issued US Patent 7,317,047; Jan. 8, 2008; not submitted separately).

* cited by examiner

HIGH WORK FUNCTION TRANSPARENT CONDUCTORS

RELATED CASE INFORMATION

The present application is a divisional application claiming priority to U.S. application Ser. No. 12/829,515, filed Jul. 2, 2010, now abandoned, which is a divisional of U.S. application Ser. No. 11/476,979, filed Jun. 28, 2006, now U.S. Pat. No. 7,749,407, which claims priority under 35 U.S.C. 119(e) to U.S. Provisional Application Ser. No. 60/694,793, filed Jun. 28, 2005, which are incorporated by reference in their entirety.

BACKGROUND INFORMATION

1. Field of the Disclosure

This disclosure relates in general to transparent conductors having workfunction greater than 4.7 eV for use in electronic devices.

2. Description of the Related Art

Organic electronic devices define a category of products that include an active layer. Such devices convert electrical energy into radiation, detect signals through electronic processes, convert radiation into electrical energy, or include one or more organic semiconductor layers.

Organic light-emitting diodes (OLEDs) are organic electronic devices comprising an organic layer capable of electroluminescence. OLEDs containing conducting polymers can have the following configuration which may include additional optional layers, materials or compositions:

anode/buffer layer/EL material/cathode

The anode is typically any material that has the ability to inject holes into the electroluminescent ("EL") material, such as, for example, indium/tin oxide (ITO). The anode is optionally supported on a glass or plastic substrate. The buffer layer is typically an electrically conducting polymer and facilitates the injection of holes from the anode into the EL material layer. EL materials include fluorescent compounds, fluorescent and phosphorescent metal complexes, conjugated polymers, and combinations and mixtures thereof. The cathode is typically any material (such as, e.g., Ca or Ba) that has the ability to inject electrons into the EL material. At least one of the anode or cathode is transparent or semi-transparent to allow for light emission.

ITO is frequently used as the transparent anode. However, the work function of ITO is relatively low, typically in the range of 4.6 eV. This low work function results in less effective injection of holes into the EL material. In some cases, the work function of ITO can be improved (i.e., raised) by surface treatment. However, these treatments are sometime not stable and result in reduced device lifetime.

It is known that conductive carbon nanotube ("CNT") dispersions can be used to form transparent, conductive films. The films have conductivity of about 6×10³ S/cm (Science, p1273-1276, vol 305, Aug. 27, 2004), which is similar to the conductivity of indium/tin oxide vapor-deposited on substrates. It is evident that CNT film could replace ITO as a transparent anode. However, the work function of CNT is in the same range as that of ITO and is not high enough to inject holes to the light emitting layer for OLEDs applications.

Thus, there is a continuing need for improved materials to form transparent anodes.

SUMMARY

There is provided a transparent conductor comprising conductive nanoparticles and at least one of (a) a fluorinated acid polymer and (b) a semiconductive polymer doped with a fluorinated acid polymer.

In another embodiment, there is provided an electronic device comprising the transparent conductor.

The foregoing general description and the following detailed description are exemplary and explanatory and are not restrictive of the disclosure and the appended claims.

BRIEF DESCRIPTION OF THE DRAWINGS

The invention is illustrated by way of example and not limitation in the accompanying figures.

Figure 1:
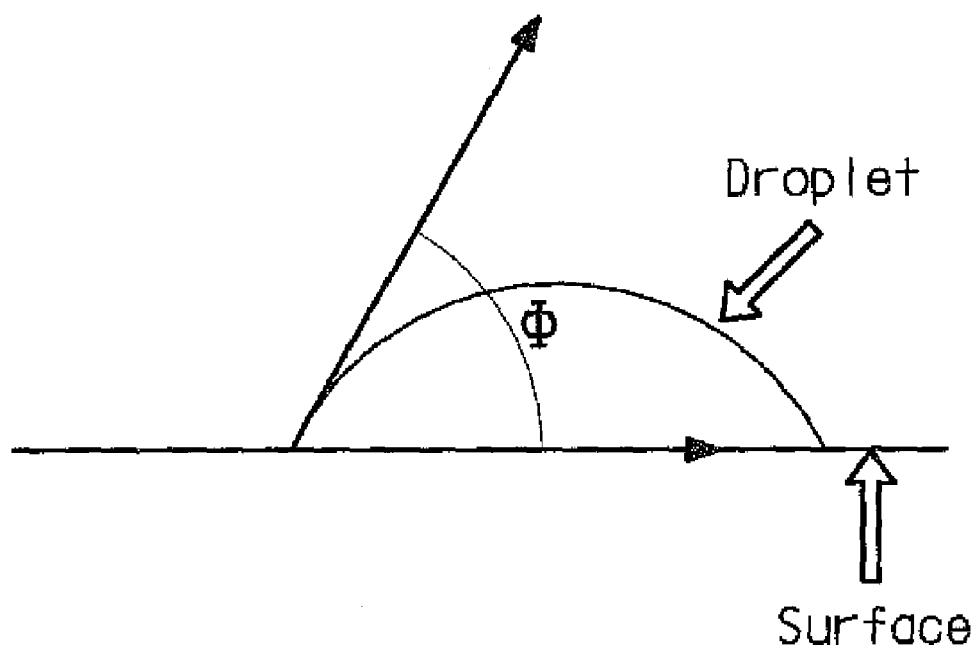
FIG. 1 is a diagram illustrating contact angle.

Skilled artisans appreciate that objects in the figures are illustrated for simplicity and clarity and have not necessarily been drawn to scale. For example, the dimensions of some of the objects in the figures may be enlarged relative to other objects to help to improve understanding of embodiments.

DETAILED DESCRIPTION

There is provided a transparent conductor having workfunction greater than 4.7 eV comprising conductive nanoparticles and at least one of (a) a fluorinated acid polymer and (b) a semiconductive polymer doped with a fluorinated acid polymer. The workfunction is defined as the energy required to remove an electron from the material to vacuum level. It is typically measured by Ultraviolet Photoemssion Spectroscopy. It can also be obtained by the Kelvin probe technique.

Many aspects and embodiments are described herein and are exemplary and not limiting. After reading this specification, skilled artisans will appreciate that other aspects and embodiments are possible without departing from the scope of the invention.

As used herein, the term "transparent" refers to a material which transmits at least 50% of incident light, in the visible range. The term "conductive nanoparticles" refers to materials which have one or more dimension less than 100 nm, and which, when formed into a film, have a conductivity greater than 1 S/cm. It is understood that the particles can have any shape, including circular, rectangular, polygonal, fibril, and irregular shapes. The term "fluorinated acid polymer" refers to a polymer having acidic groups, where at least some of the hydrogens have been replaced by fluorine. This fluorination may occur on the polymer backbone, on side chains attached to the backbone, pendant groups, or combinations of these. The term "acidic group" refers to a group capable of ionizing to donate a hydrogen ion to a base to form a salt. As used herein, the term "semiconductive polymer" refers to any polymer or oligomer which is inherently or intrinsically capable of electrical conductivity without the addition of carbon black or conductive metal particles. The term "polymer" encompasses homopolymers and copolymers. Copolymers may be formed of monomers having different structures or monomers of the same structure with different substituents. The term "doped" is intended to mean that the semiconductive polymer has a polymeric counterion derived from a polymeric acid to balance the charge on the conductive polymer.

1. Conductive Nanoparticles

In one embodiment, the conductive nanoparticles form films having conductivity greater than 10 S/cm. In one embodiment, the conductivity is greater than 20 S/cm. In one embodiment, the conductive nanoparticles have at least one dimension less than 50 nm. In one embodiment, the conductive nanoparticles have at least one dimension less than 30 nm.

Some exemplary types of conductive nanoparticles include, but are not limited to, carbon nanotubes and nanofibers, metal nanoparticles, and metal nanofibers.

Carbon nanotubes are elongated fullerenes where the walls of the tubes comprise hexagonal polyhedra formed by groups of six carbon atoms and are often capped at ends. Fullerenes are any of various cagelike, hollow molecules composed of hexagonal and pentagonal groups of atoms that constitute the third form of carbon after diamond and graphite. Presently, there are three main approaches for the synthesis of single- and multi-walled carbon nanotubes. These include the electric arc discharge of graphite rod (Journet et al. Nature 388: 756 (1997)), the laser ablation of carbon (Thess et al. Science 273: 483 (1996)), and the chemical vapor deposition of hydrocarbons (Ivanov et al. Chem. Phys. Lett 223: 329 (1994); Li et al. Science 274: 1701 (1996)). Carbon nanotubes may be only a few nanometers in diameter, yet up to a millimeter long, so that the length-to-width aspect ratio is extremely high. Carbon nanotubes also include nano-mat of carbon nanotubes. Carbon nanotubes and dispersions of carbon nanotubes in various solvents are commercially available.

Carbon nanofibers are similar to carbon nanotubes in shape and diameter, but comprise carbon composites in a non-hollow, fibrous form, whereas carbon nanotubes are in the form of a hollow tube. Carbon nanofibers can be formed using a method similar to the synthetic methods for carbon nanotubes.

The metal nanoparticles and nanofibers can be made from any conductive metals, including, but not limited to, silver, nickel, gold, copper, palladium, and mixtures thereof. Metal nanoparticles are available commercially. The formation of nanofibers is possible through a number of different approaches that are well known to those of skill in the art.

In one embodiment, the conductive nano-particles are in the form of an aqueous dispersion. In one embodiment, the aqueous dispersion further comprises a surfactant, which can be an anionic, cationic, or non-ionic surfactant.

In one embodiment, the conductive nanoparticles are in the form of a non-aqueous dispersion.

2. Semiconductive Polymer

Any semiconductive polymer doped with a fluorinated acid polymer can be used in the new composition. In one embodiment, the doped semiconductive polymer will form a film which has a conductivity of at least $10^{-7}$ S/cm. The semiconductive polymers suitable for the new composition can be homopolymers, or they can be copolymers of two or more respective monomers. The monomer from which the conductive polymer is formed, is referred to as a "precursor monomer". A copolymer will have more than one precursor monomer.

In one embodiment, the semiconductive polymer is made from at least one precursor monomer selected from thiophenes, pyrroles, anilines, and polycyclic aromatics. The polymers made from these monomers are referred to herein as polythiophenes, polypyrroles, polyanilines, and polycyclic aromatic polymers, respectively. The term "polycyclic aromatic" refers to compounds having more than one aromatic ring. The rings may be joined by one or more bonds, or they may be fused together. The term "aromatic ring" is intended to include heteroaromatic rings. A "polycyclic heteroaromatic" compound has at least one heteroaromatic ring.

In one embodiment, thiophene monomers contemplated for use to form the semiconductive polymer comprise Formula I below:

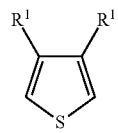

(I)

wherein:
$R^1$ is independently selected so as to be the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, ester sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms.

As used herein, the term "alkyl" refers to a group derived from an aliphatic hydrocarbon and includes linear, branched and cyclic groups which may be unsubstituted or substituted. The term "heteroalkyl" is intended to mean an alkyl group, wherein one or more of the carbon atoms within the alkyl group has been replaced by another atom, such as nitrogen, oxygen, sulfur, and the like. The term "alkylene" refers to an alkyl group having two points of attachment.

As used herein, the term "alkenyl" refers to a group derived from an aliphatic hydrocarbon having at least one carbon-carbon double bond, and includes linear, branched and cyclic groups which may be unsubstituted or substituted. The term "heteroalkenyl" is intended to mean an alkenyl group, wherein one or more of the carbon atoms within the alkenyl group has been replaced by another atom, such as nitrogen, oxygen, sulfur, and the like. The term "alkenylene" refers to an alkenyl group having two points of attachment.

As used herein, the following terms for substituent groups refer to the formulae given below:
"alcohol" —$R^3$—OH
"amido" —$R^3$—C(O)N($R^6$)$R^6$
"amidosulfonate" —$R^3$—C(O)N($R^6$)$R^4$—SO$_3$Z
"benzyl" —CH$_2$—C$_6$H$_5$
"carboxylate" —$R^3$—C(O)O—Z or —$R^3$—O—C(O)—Z
"ether" —$R^3$—(O—$R^5$)$_p$—O—$R^5$
"ether carboxylate" —$R^3$—O—$R^4$—C(O)O—Z or —$R^3$—O—$R^4$—O—C(O)—Z
"ether sulfonate" —$R^3$—O—$R^4$—SO$_3$Z
"ester sulfonate" —$R^3$—O—C(O)—$R^4$—SO$_3$Z
"sulfonimide" —$R^3$—SO$_2$—NH—SO$_2$—$R^5$
"urethane" —$R^3$—O—C(O)—N($R^6$)$_2$
where all "R" groups are the same or different at each occurrence and:
$R^3$ is a single bond or an alkylene group
$R^4$ is an alkylene group
$R^5$ is an alkyl group
$R^6$ is hydrogen or an alkyl group
p is 0 or an integer from 1 to 20
Z is H, alkali metal, alkaline earth metal, N($R^5$)$_4$ or $R^5$
Any of the above groups may further be unsubstituted or substituted, and any group may have F substituted for one or more hydrogens, including perfluorinated groups. In one embodiment, the alkyl and alkylene groups have from 1-20 carbon atoms.

In one embodiment, in the thiophene monomer, both $R^1$ together form —O—$(CHY)_m$—O—, where m is 2 or 3, and Y is the same or different at each occurrence and is selected from hydrogen, halogen, alkyl, alcohol, amidosulfonate, benzyl, carboxylate, ether, ether carboxylate, ether sulfonate, ester sulfonate, and urethane, where the Y groups may be partially or fully fluorinated. In one embodiment, all Y are hydrogen. In one embodiment, the polythiophene is poly(3,4-ethylenedioxythiophene). In one embodiment, at least one Y group is not hydrogen. In one embodiment, at least one Y group is a substituent having F substituted for at least one hydrogen. In one embodiment, at least one Y group is perfluorinated.

In one embodiment, the thiophene monomer has Formula I(a):

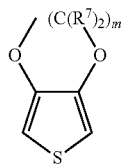

(Ia)

wherein:
$R^7$ is the same or different at each occurrence and is selected from hydrogen, alkyl, heteroalkyl, alkenyl, heteroalkenyl, alcohol, amidosulfonate, benzyl, carboxylate, ether, ether carboxylate, ether sulfonate, ester sulfonate, and urethane, with the proviso that at least one $R^7$ is not hydrogen, and m is 2 or 3.

In one embodiment of Formula I(a), m is two, one $R^7$ is an alkyl group of more than 5 carbon atoms, and all other $R^7$ are hydrogen. In one embodiment of Formula I(a), at least one $R^7$ group is fluorinated. In one embodiment, at least one $R^7$ group has at least one fluorine substituent. In one embodiment, the $R^7$ group is fully fluorinated.

In one embodiment of Formula I(a), the $R^7$ substituents on the fused alicyclic ring on the thiophene offer improved solubility of the monomers in water and facilitate polymerization in the presence of the fluorinated acid polymer.

In one embodiment of Formula I(a), m is 2, one $R^7$ is sulfonic acid-propylene-ether-methylene and all other $R^7$ are hydrogen. In one embodiment, m is 2, one $R^7$ is propyl-ether-ethylene and all other $R^7$ are hydrogen. In one embodiment, m is 2, one $R^7$ is methoxy and all other $R^7$ are hydrogen. In one embodiment, one $R^7$ is sulfonic acid difluoromethylene ester methylene (—$CH_2$—O—C(O)—$CF_2$—$SO_3H$), and all other $R^7$ are hydrogen.

In one embodiment, pyrrole monomers contemplated for use to form the semiconductive polymer comprise Formula II below.

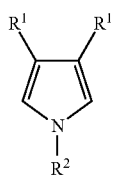

(II)

where in Formula II:
$R^1$ is independently selected so as to be the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, amidosulfonate, ether carboxylate, ether sulfonate, ester sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms; and $R^2$ is independently selected so as to be the same or different at each occurrence and is selected from hydrogen, alkyl, alkenyl, aryl, alkanoyl, alkylthioalkyl, alkylaryl, arylalkyl, amino, epoxy, silane, siloxane, alcohol, benzyl, carboxylate, ether, ether carboxylate, ether sulfonate, ester sulfonate, and urethane.

In one embodiment, $R^1$ is the same or different at each occurrence and is independently selected from hydrogen, alkyl, alkenyl, alkoxy, cycloalkyl, cycloalkenyl, alcohol, benzyl, carboxylate, ether, amidosulfonate, ether carboxylate, ether sulfonate, ester sulfonate, urethane, epoxy, silane, siloxane, and alkyl substituted with one or more of sulfonic acid, carboxylic acid, acrylic acid, phosphoric acid, phosphonic acid, halogen, nitro, cyano, hydroxyl, epoxy, silane, or siloxane moieties.

In one embodiment, $R^2$ is selected from hydrogen, alkyl, and alkyl substituted with one or more of sulfonic acid, carboxylic acid, acrylic acid, phosphoric acid, phosphonic acid, halogen, cyano, hydroxyl, epoxy, silane, or siloxane moieties.

In one embodiment, the pyrrole monomer is unsubstituted and both $R^1$ and $R^2$ are hydrogen.

In one embodiment, both $R^1$ together form a 6- or 7-membered alicyclic ring, which is further substituted with a group selected from alkyl, heteroalkyl, alcohol, benzyl, carboxylate, ether, ether carboxylate, ether sulfonate, ester sulfonate, and urethane. These groups can improve the solubility of the monomer and the resulting polymer. In one embodiment, both $R^1$ together form a 6- or 7-membered alicyclic ring, which is further substituted with an alkyl group. In one embodiment, both $R^1$ together form a 6- or 7-membered alicyclic ring, which is further substituted with an alkyl group having at least 1 carbon atom.

In one embodiment, both $R^1$ together form —O—$(CHY)_m$—O—, where m is 2 or 3, and Y is the same or different at each occurrence and is selected from hydrogen, alkyl, alcohol, benzyl, carboxylate, amidosulfonate, ether, ether carboxylate, ether sulfonate, ester sulfonate, and urethane. In one embodiment, at least one Y group is not hydrogen. In one embodiment, at least one Y group is a substituent having F substituted for at least one hydrogen. In one embodiment, at least one Y group is perfluorinated.

In one embodiment, aniline monomers contemplated for use to form the semiconductive polymer comprise Formula III below.

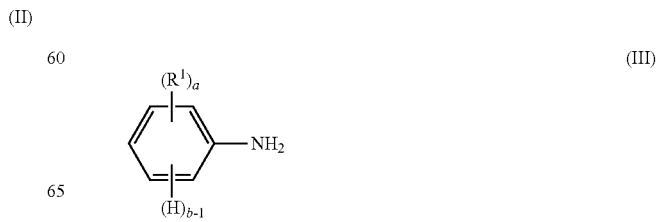

(III)

wherein:
a is 0 or an integer from 1 to 4;
b is an integer from 1 to 5, with the proviso that a+b=5; and
$R^1$ is independently selected so as to be the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, ester sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms.

When polymerized, the aniline monomeric unit can have Formula IV(a) or Formula IV(b) shown below, or a combination of both formulae.

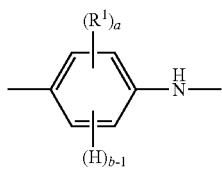

IV(a)

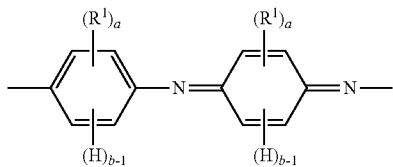

IV(b)

where a, b and $R^1$ are as defined above.

In one embodiment, the aniline monomer is unsubstituted and a=0.

In one embodiment, a is not 0 and at least one $R^1$ is fluorinated. In one embodiment, at least one $R^1$ is perfluorinated.

In one embodiment, fused polycyclic heteroaromatic monomers contemplated for use to form the semiconductive polymer have two or more fused aromatic rings, at least one of which is heteroaromatic. In one embodiment, the fused polycyclic heteroaromatic monomer has Formula V:

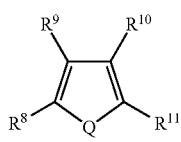

(V)

wherein:
Q is S or $NR^6$;
$R^6$ is hydrogen or alkyl;
$R^8$, $R^9$, $R^{10}$, and $R^{11}$ are independently selected so as to be the same or different at each occurrence and are selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, nitrile, cyano, hydroxyl, epoxy, silane, siloxane, alcohol, benzyl, carboxylate, ether, ether carboxylate, amidosulfonate, ether sulfonate, ester sulfonate, and urethane; and
at least one of Wand $R^9$, $R^9$ and $R^{10}$, and $R^{19}$ and $R^{11}$ together form an alkenylene chain completing a 5 or 6-membered aromatic ring, which ring may optionally include one or more divalent nitrogen, sulfur or oxygen atoms.

In one embodiment, the fused polycyclic heteroaromatic monomer has Formula V(a), V(b), V(c), V(d), V(e), V(f), and V(g):

(Va)

(Vb)

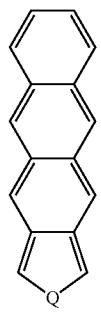

(Vc)

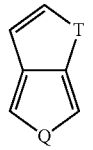

(Vd)

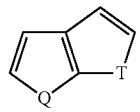

(Ve)

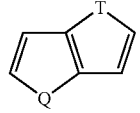

(Vf)

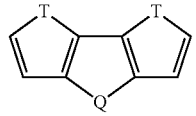

(Vg)

wherein:

Q is S or NH; and

T is the same or different at each occurrence and is selected from S, $NR^6$, O, $SiR^6_2$, Se, and $PR^6$;

$R^6$ is hydrogen or alkyl.

The fused polycyclic heteroaromatic monomers may be substituted with groups selected from alkyl, heteroalkyl, alcohol, benzyl, carboxylate, ether, ether carboxylate, ether sulfonate, ester sulfonate, and urethane. In one embodiment, the substituent groups are fluorinated. In one embodiment, the substituent groups are fully fluorinated.

In one embodiment, the fused polycyclic heteroaromatic monomer is a thieno(thiophene). Such compounds have been discussed in, for example, Macromolecules, 34, 5746-5747 (2001); and Macromolecules, 35, 7281-7286 (2002). In one embodiment, the thieno(thiophene) is selected from thieno(2,3-b)thiophene, thieno(3,2-b)thiophene, and thieno(3,4-b) thiophene. In one embodiment, the thieno(thiophene)monomer is substituted with at least one group selected from alkyl, heteroalkyl, alcohol, benzyl, carboxylate, ether, ether carboxylate, ether sulfonate, ester sulfonate, and urethane. In one embodiment, the substituent groups are fluorinated. In one embodiment, the substituent groups are fully fluorinated.

In one embodiment, polycyclic heteroaromatic monomers contemplated for use to form the copolymer in the new composition comprise Formula VI:

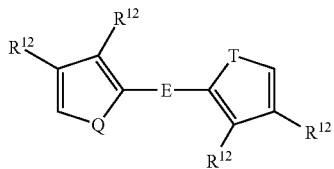

(VI)

wherein:

Q is S or $NR^6$;

T is selected from S, $NR^6$, O, $SiR^6_2$, Se, and $PR^6$;

E is selected from alkenylene, arylene, and heteroarylene;

$R^6$ is hydrogen or alkyl;

$R^{12}$ is the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, nitrile, cyano, hydroxyl, epoxy, silane, siloxane, alcohol, benzyl, carboxylate, ether, ether carboxylate, amidosulfonate, ether sulfonate, ester sulfonate, and urethane; or both $R^{12}$ groups together may form an alkylene or alkenylene chain completing a 3, 4, 5, 6, or 7-membered aromatic or alicyclic ring, which ring may optionally include one or more divalent nitrogen, sulfur or oxygen atoms.

In one embodiment, the semiconductive polymer is a copolymer of a precursor monomer and at least one second monomer. Any type of second monomer can be used, so long as it does not detrimentally affect the desired properties of the copolymer. In one embodiment, the second monomer comprises no more than 50% of the copolymer, based on the total number of monomer units. In one embodiment, the second monomer comprises no more than 30%, based on the total number of monomer units. In one embodiment, the second monomer comprises no more than 10%, based on the total number of monomer units.

Exemplary types of second precursor monomers include, but are not limited to, alkenyl, alkynyl, arylene, and heteroarylene. Examples of second monomers include, but are not limited to, fluorene, oxadiazole, thiadiazole, benzothiadiazole, phenylenevinylene, phenyleneethynylene, pyridine, diazines, and triazines, all of which may be further substituted.

In one embodiment, the copolymers are made by first forming an intermediate precursor monomer having the structure A-B-C, where A and C represent first precursor monomers, which can be the same or different, and B represents a second precursor monomer. The A-B-C intermediate precursor monomer can be prepared using standard synthetic organic techniques, such as Yamamoto, Stille, Grignard metathesis, Suzuki, and Negishi couplings. The copolymer is then formed by oxidative polymerization of the intermediate precursor monomer alone, or with one or more additional precursor monomers.

In one embodiment, the semiconductive polymer is a copolymer of two or more precursor monomers. In one embodiment, the first precursor monomers are selected from a thiophene, a pyrrole, an aniline, and a polycyclic aromatic.

3. Fluorinated Acid Polymer

The fluorinated acid polymer (hereinafter referred to as "FAP") can be any polymer which is fluorinated and has acidic groups. As used herein, the term "fluorinated" means that at least one hydrogen bonded to a carbon has been replaced with a fluorine. The term includes partially and fully fluorinated materials. In one embodiment, the fluorinated acid polymer is highly fluorinated. The term "highly fluorinated" means that at least 50% of the available hydrogens bonded to a carbon, have been replaced with fluorine. The term "acidic group" refers to a group capable of ionizing to donate a hydrogen ion to a Brønsted base to form a salt. The acidic groups supply an ionizable proton. In one embodiment, the acidic group has a pKa of less than 3. In one embodiment, the acidic group has a pKa of less than 0. In one embodiment, the acidic group has a pKa of less than −5. The acidic group can be attached directly to the polymer backbone, or it can be attached to side chains on the polymer backbone. Examples of acidic groups include, but are not limited to, carboxylic acid groups, sulfonic acid groups, sulfonimide groups, phosphoric acid groups, phosphonic acid groups, and combinations thereof. The acidic groups can all be the same, or the polymer may have more than one type of acidic group.

In one embodiment, the FAP is organic solvent wettable ("wettable FAP"). The term "organic solvent wettable" refers to a material which, when formed into a film, is wettable by organic solvents. The term also includes polymeric acids which are not film-forming alone, but which when doped into a semiconductive polymer will form a film which is wettable. In one embodiment, the organic solvent wettable material forms a film which is wettable by phenylhexane with a contact angle less than 40°.

In one embodiment, the FAP is organic solvent non-wettable ("non-wettable FAP"). The term "organic solvent non-wettable" refers to a material which, when formed into a film, is not wettable by organic solvents. The term also includes polymeric acids which are not film-forming alone, but which when doped into a semiconductive polymer will form a film which is non-wettable. In one embodiment, the organic solvent non-wettable material forms a film on which phenylhexane has a contact angle greater than 40°.

As used herein, the term "contact angle" is intended to mean the angle Φ shown in FIG. 1. For a droplet of liquid medium, angle Φ is defined by the intersection of the plane of the surface and a line from the outer edge of the droplet to the surface. Furthermore, angle Φ is measured after the droplet has reached an equilibrium position on the surface after being applied, i.e. "static contact angle". The film of the organic solvent wettable fluorinated polymeric acid is represented as the surface. In one embodiment, the contact angle is no greater than 35°. In one embodiment, the contact angle is no greater than 30°. The methods for measuring contact angles are well known.

In one embodiment, the FAP is water-soluble. In one embodiment, the FAP is dispersible in water. In one embodiment, the FAP forms a colloidal dispersion in water.

In one embodiment, the polymer backbone is fluorinated. Examples of suitable polymeric backbones include, but are not limited to, polyolefins, polyacrylates, polymethacrylates, polyimides, polyamides, polyaramids, polyacrylamides, polystyrenes, and copolymers thereof. In one embodiment, the polymer backbone is highly fluorinated. In one embodiment, the polymer backbone is fully fluorinated.

In one embodiment, the acidic groups are selected from sulfonic acid groups and sulfonimide groups. In one embodiment, the acidic groups are on a fluorinated side chain. In one embodiment, the fluorinated side chains are selected from alkyl groups, alkoxy groups, amido groups, ether groups, and combinations thereof.

In one embodiment, the wettable FAP has a fluorinated olefin backbone, with pendant fluorinated ether sulfonate, fluorinated ester sulfonate, or fluorinated ether sulfonimide groups. In one embodiment, the polymer is a copolymer of 1,1-difluoroethylene and 2-(1,1-difluoro-2-(trifluoromethyl) allyloxy)-1,1,2,2-tetrafluoroethanesulfonic acid. In one embodiment, the polymer is a copolymer of ethylene and 2-(2-(1,2,2-trifluorovinyloxy)-1,1,2,3,3,3-hexafluoropropoxy)-1,1,2,2-tetrafluoroethanesulfonic acid. These copolymers can be made as the corresponding sulfonyl fluoride polymer and then can be converted to the sulfonic acid form.

In one embodiment, the wettable FAP is homopolymer or copolymer of a fluorinated and partially sulfonated poly (arylene ether sulfone). The copolymer can be a block copolymer. Examples of comonomers include, but are not limited to butadiene, butylene, isobutylene, styrene, and combinations thereof.

In one embodiment, the wettable FAP is a homopolymer or copolymer of monomers having Formula VII:

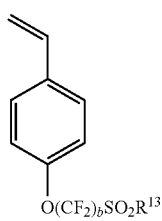

(VII)

where:
b is an integer from 1 to 5,
$R^{13}$ is OH or $NHR^{14}$, and
$R^{14}$ is alkyl, fluoroalkyl, sulfonylalkyl, or sulfonylfluoroalkyl.

In one embodiment, the monomer is "SFS" or SFSI" shown below:

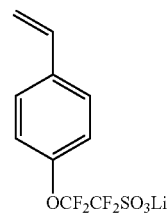

SFS

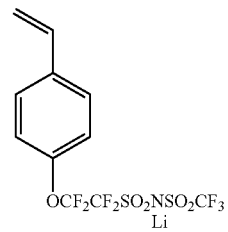

SFSI

After polymerization, the polymer can be converted to the acid form.

In one embodiment, the wettable FAP is a homopolymer or copolymer of a trifluorostyrene having acidic groups. In one embodiment, the trifluorostyrene monomer has Formula VIII:

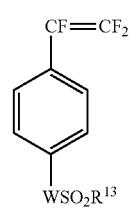

(VIII)

where:
W is selected from $(CF_2)_q$, $O(CF_2)_q$, $S(CF_2)_q$, $(CF_2)_qO(CF_2)_r$, and $SO_2(CF_2)_q$,
b is independently an integer from 1 to 5,
$R^{13}$ is OH or $NHR^{14}$, and
$R^{14}$ is alkyl, fluoroalkyl, sulfonylalkyl, or sulfonylfluoroalkyl.

In one embodiment, the monomer containing W equal to $S(CF_2)_q$ is polymerized then oxidized to give the polymer containing W equal to $SO_2(CF_2)_q$. In one embodiment, the polymer containing $R^{13}$ equal to F is converted its acid form where $R^{13}$ is equal to OH or $NHR^{14}$.

In one embodiment, the wettable FAP is a sulfonimide polymer having Formula IX:

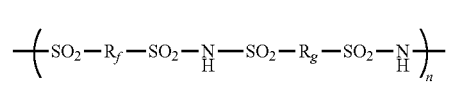

(IX)

where:
$R_f$ is selected from fluorinated alkylene, fluorinated heteroalkylene, fluorinated arylene, or fluorinated heteroarylene;
$R_g$ is selected from fluorinated alkylene, fluorinated heteroalkylene, fluorinated arylene, fluorinated heteroarylene, arylene, or heteroarylene; and
n is at least 4.

In one embodiment of Formula IX, $R_f$ and $R_g$ are perfluoroalkylene groups. In one embodiment, $R_f$ and $R_g$ are perfluorobutylene groups. In one embodiment, $R_f$ and $R_g$ contain ether oxygens. In one embodiment, n is greater than 20.

In one embodiment, the wettable FAP comprises a fluorinated polymer backbone and a side chain having Formula X:

$$\text{—O—}R^{15}\text{—}SO_2\text{—}NH\text{—}(SO_2\text{—}R_g\text{—}SO_2\text{—}\underset{H}{N})_p\text{—}SO_2R^{16} \quad (X)$$

where:
$R_g$ is selected from fluorinated alkylene, fluorinated heteroalkylene, fluorinated arylene, fluorinated heteroarylene, arylene, or heteroarylene;
$R^{15}$ is a fluorinated alkylene group or a fluorinated heteroalkylene group;
$R^{16}$ is a fluorinated alkyl or a fluorinated aryl group; and
p is 0 or an integer from 1 to 4.

In one embodiment, the wettable FAP has Formula XI:

$$\left[ (CF_2\text{—}CF_2)_c(CF_2\text{—}CF)\!\!\underset{\underset{(CF_2\text{—}CF\text{—}O)_c(CF_2)_c\text{—}SO_2\text{—}\underset{H}{N}\text{—}(SO_2\text{—}(CF_2)_c\text{—}SO_2\text{—}\underset{H}{N})_c\text{—}SO_2R_{16}}{|\,R^{16}}}{\overset{|}{\underset{|}{O}}} \right]_n \quad (XI)$$

where:
$R^{16}$ is a fluorinated alkyl or a fluorinated aryl group;
a, b, c, d, and e are each independently 0 or an integer from 1 to 4; and
n is at least 4.

The synthesis of these fluorinated acid polymers has been described in, for example, A. Feiring et al., J. Fluorine Chemistry 2000, 105, 129-135; A. Feiring et al., Macromolecules 2000, 33, 9262-9271; D. D. Desmarteau, J. Fluorine Chem. 1995, 72, 203-208; A. J. Appleby et al., J. Electrochem. Soc. 1993, 140(1), 109-111; and Desmarteau, U.S. Pat. No. 5,463,005.

In one embodiment, the wettable FAP comprises at least one repeat unit derived from an ethylenically unsaturated compound having Formula XII:

(XII)

wherein d is 0, 1, or 2;
$R^{17}$ to $R^{20}$ are independently H, halogen, alkyl or alkoxy of 1 to 10 carbon atoms, Y, $C(R_f')(R_f')OR^{21}$, $R^4Y$ or $OR^4Y$;
Y is $COE^2$, $SO_2 E^2$, or sulfonimide;
$R^{21}$ is hydrogen or an acid-labile protecting group;
$R_f'$ is the same or different at each occurrence and is a fluoroalkyl group of 1 to 10 carbon atoms, or taken together are $(CF_2)_e$ where e is 2 to 10;
$R^4$ is an alkylene group;
$E^2$ is OH, halogen, or $OR^7$; and
$R^5$ is an alkyl group;
with the proviso that at least one of $R^{17}$ to $R^{20}$ is Y, $R^4Y$ or $OR^4Y$.

$R^4$, $R^5$, and $R^{17}$ to $R^{20}$ may optionally be substituted by halogen or ether oxygen.

Some illustrative, but nonlimiting, examples of representative monomers of Formula XII are presented below as Formulas XIIa-XIIe:

(XIIa)

-continued (XIIb)

(XIIc)

(XIId)

(XIIe)

wherein $R^{21}$ is a group capable of forming or rearranging to a tertiary cation, more typically an alkyl group of 1 to 20 carbon atoms, and most typically t-butyl.

Compounds of Formula XII wherein d=0, (e.g., Formula XII-a), may be prepared by cycloaddition reaction of unsaturated compounds of structure (XIII) with quadricyclane (tetracyclo[2.2.1.0$^{2,6}$0$^{3,5}$]heptane) as shown in the equation below.

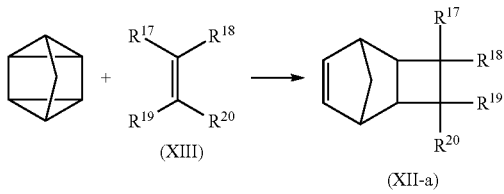

The reaction may be conducted at temperatures ranging from about 0° C. to about 200° C., more typically from about 30° C. to about 150° C. in the absence or presence of an inert solvent such as diethyl ether. For reactions conducted at or above the boiling point of one or more of the reagents or solvent, a closed reactor is typically used to avoid loss of volatile components. Compounds of structure (XII) with higher values of d (i.e., d=1 or 2) may be prepared by reaction of compounds of structure (XII) with d=0 with cyclopentadiene, as is known in the art.

In one embodiment, the wettable FAP is a copolymer which also comprises a repeat unit derived from at least one fluoroolefin, which is an ethylenically unsaturated compound containing at least one fluorine atom attached to an ethylenically unsaturated carbon. The fluoroolefin comprises 2 to 20 carbon atoms. Representative fluoroolefins include, but are not limited to, tetrafluoroethylene, hexafluoropropylene, chlorotrifluoroethylene, vinylidene fluoride, vinyl fluoride, perfluoro-(2,2-dimethyl-1,3-dioxole), perfluoro-(2-methylene-4-methyl-1,3-dioxolane), $CF_2=CFO(CF_2)_tCF=CF_2$, where t is 1 or 2, and $R_f''OCF=CF_2$ wherein $R_f''$ is a saturated fluoroalkyl group of from 1 to about ten carbon atoms. In one embodiment, the comonomer is tetrafluoroethylene.

In one embodiment, the non-wettable FAP comprises a polymeric backbone having pendant groups comprising siloxane sulfonic acid. In one embodiment, the siloxane pendant groups have the formula below:

—$O_aSi(OH)_{b-a}R^{22}_{3-b}R^{23}R_fSO_3H$ wherein:

a is from 1 to b;

b is from 1 to 3;

$R^{22}$ is a non-hydrolyzable group independently selected from the group consisting of alkyl, aryl, and arylalkyl;

$R^{23}$ is a bidentate alkylene radical, which may be substituted by one or more ether oxygen atoms, with the proviso that $R^{23}$ has at least two carbon atoms linearly disposed between Si and $R_f$; and $R_f$ is a perfluoroalkylene radical, which may be substituted by one or more ether oxygen atoms.

In one embodiment, the non-wettable FAP having pendant siloxane groups has a fluorinated backbone. In one embodiment, the backbone is perfluorinated.

In one embodiment, the non-wettable FAP has a fluorinated backbone and pendant groups represented by the Formula (XIV)

—$O_g$—[$CF(R_f^2)CF$—$O_h]_i$—$CF_2CF_2SO_3H$ (XIV)

wherein $R_f^2$ is F or a perfluoroalkyl radical having 1-10 carbon atoms either unsubstituted or substituted by one or more ether oxygen atoms, h=0 or 1, i=0 to 3, and g=0 or 1.

In one embodiment, the non-wettable FAP has formula (XV)

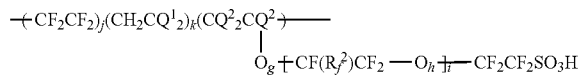

(XV)

where j≧0, k≧0 and 4≦(j+k)≦199, $Q^1$ and $Q^2$ are F or H, $R_f^2$ is F or a perfluoroalkyl radical having 1-10 carbon atoms either unsubstituted or substituted by one or more ether oxygen atoms, h=0 or 1, i=0 to 3, g=0 or 1, and $E^4$ is H or an alkali metal. In one embodiment $R_f^2$ is —$CF_3$, g=1, h=1, and i=1. In one embodiment the pendant group is present at a concentration of 3-10 mol-%.

In one embodiment, $Q^1$ is H, k≧0, and $Q^2$ is F, which may be synthesized according to the teachings of Connolly et al., U.S. Pat. No. 3,282,875. In another preferred embodiment, $Q^1$ is H, $Q^2$ is H, g=0, $R_f^2$ is F, h=1, and i-1, which may be synthesized according to the teachings of co-pending application Ser. No. 60/105,662. Still other embodiments may be synthesized according to the various teachings in Drysdale et al., WO 9831716(A1), and co-pending US applications Choi et al, WO 99/52954(A1), and 60/176,881.

In one embodiment, the non-wettable FAP is a colloid-forming polymeric acid. As used herein, the term "colloid-forming" refers to materials that are insoluble in water, and form colloids when dispersed into an aqueous medium. The colloid-forming polymeric acids typically have a molecular weight in the range of about 10,000 to about 4,000,000. In one embodiment, the polymeric acids have a molecular weight of about 100,000 to about 2,000,000. Colloid particle size typically ranges from 2 nanometers (nm) to about 140 nm. In one embodiment, the colloids have a particle size of 2 nm to about 30 nm. Any colloid-forming polymeric material having acidic protons can be used. In one embodiment, the colloid-forming fluorinated polymeric acid has acidic groups selected from carboxylic groups, sulfonic acid groups, and sulfonimide groups. In one embodiment, the colloid-forming fluorinated polymeric acid is a polymeric sulfonic acid. In one embodiment, the colloid-forming polymeric sulfonic acid is perfluorinated. In one embodiment, the colloid-forming polymeric sulfonic acid is a perfluoroalkylenesulfonic acid.

In one embodiment, the non-wettable colloid-forming FAP. is a highly-fluorinated sulfonic acid polymer ("FSA polymer"). "Highly fluorinated" means that at least about 50% of the total number of halogen and hydrogen atoms in the polymer are fluorine atoms, an in one embodiment at least about 75%, and in another embodiment at least about 90%. In one embodiment, the polymer is perfluorinated. The term "sulfonate functional group" refers to either to sulfonic acid groups or salts of sulfonic acid groups, and in one embodiment alkali metal or ammonium salts. The functional group is represented by the formula —$SO_3E^5$ where $E^5$ is a cation, also known as a "counterion". $E^5$ may be H, Li, Na, K or $N(R_1)(R_2)(R_3)(R_4)$, and $R_1, R_2, R_3$, and $R_4$ are the same or different and are and in one embodiment H, $CH_3$ or $C_2H_5$. In another embodiment, $E^5$ is H, in which case the polymer is said to be in the "acid form". $E^5$ may also be multivalent, as represented by such ions as $Ca^{++}$, and $Al^{+++}$. It is clear to the skilled artisan that in the case of multivalent counterions, represented generally as $M^{x+}$, the number of sulfonate functional groups per counterion will be equal to the valence "x".

In one embodiment, the FSA polymer comprises a polymer backbone with recurring side chains attached to the backbone, the side chains carrying cation exchange groups. Polymers include homopolymers or copolymers of two or more monomers. Copolymers are typically formed from a non-functional monomer and a second monomer carrying the cation exchange group or its precursor, e.g., a sulfonyl fluoride group (—$SO_2F$), which can be subsequently hydrolyzed to a sulfonate functional group. For example, copolymers of a first fluorinated vinyl monomer together with a second fluorinated vinyl monomer having a sulfonyl fluoride group (—$SO_2F$) can be used. Possible first monomers include tetrafluoroethylene (TFE), hexafluoropropylene, vinyl fluoride, vinylidine fluoride, trifluoroethylene, chlorotrifluoroethylene, perfluoro(alkyl vinyl ether), and combinations thereof. TFE is a preferred first monomer.

In other embodiments, possible second monomers include fluorinated vinyl ethers with sulfonate functional groups or precursor groups which can provide the desired side chain in the polymer. Additional monomers, including ethylene, propylene, and R—CH=$CH_2$ where R is a perfluorinated alkyl group of 1 to 10 carbon atoms, can be incorporated into these polymers if desired. The polymers may be of the type referred to herein as random copolymers, that is, copolymers made by polymerization in which the relative concentrations of the comonomers are kept as constant as possible, so that the distribution of the monomer units along the polymer chain is in accordance with their relative concentrations and relative reactivities. Less random copolymers, made by varying relative concentrations of monomers in the course of the polymerization, may also be used. Polymers of the type called block copolymers, such as that disclosed in European Patent Application No. 1 026 152 A1, may also be used.

In one embodiment, FSA polymers for use in the present invention include a highly fluorinated, and in one embodiment perfluorinated, carbon backbone and side chains represented by the formula

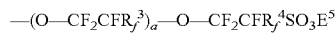

wherein $R_f^3$ and $R_f^4$ are independently selected from F, Cl or a perfluorinated alkyl group having 1 to 10 carbon atoms, a=0, 1 or 2, and $E^5$ is H, Li, Na, K or N(R1)(R2)(R3)(R4) and R1, R2, R3, and R4 are the same or different and are and in one embodiment H, $CH_3$ or $C_2H_5$. In another embodiment $E^5$ is H. As stated above, $E^5$ may also be multivalent.

In one embodiment, the FSA polymers include, for example, polymers disclosed in U.S. Pat. No. 3,282,875 and in U.S. Pat. Nos. 4,358,545 and 4,940,525. An example of preferred FSA polymer comprises a perfluorocarbon backbone and the side chain represented by the formula

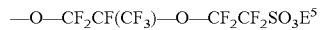

where X is as defined above. FSA polymers of this type are disclosed in U.S. Pat. No. 3,282,875 and can be made by copolymerization of tetrafluoroethylene (TFE) and the perfluorinated vinyl ether $CF_2$=CF—O—$CF_2CF(CF_3)$—O—$CF_2CF_2SO_2F$, perfluoro(3,6-dioxa-4-methyl-7-octenesulfonyl fluoride) (PDMOF), followed by conversion to sulfonate groups by hydrolysis of the sulfonyl fluoride groups and ion exchanged as necessary to convert them to the desired ionic form. An example of a polymer of the type disclosed in U.S. Pat. Nos. 4,358,545 and 4,940,525 has the side chain —O—$CF_2CF_2SO_3E^5$, wherein $E^5$ is as defined above. This polymer can be made by copolymerization of tetrafluoroethylene (TFE) and the perfluorinated vinyl ether $CF_2$=CF—O—$CF_2CF_2SO_2F$, perfluoro(3-oxa-4-pentenesulfonyl fluoride) (POPF), followed by hydrolysis and further ion exchange as necessary.

In one embodiment, the FSA polymers for use in this invention typically have an ion exchange ratio of less than about 33. In this application, "ion exchange ratio" or "IXR" is defined as number of carbon atoms in the polymer backbone in relation to the cation exchange groups. Within the range of less than about 33, IXR can be varied as desired for the particular application. In one embodiment, the IXR is about 3 to about 33, and in another embodiment about 8 to about 23.

The cation exchange capacity of a polymer is often expressed in terms of equivalent weight (EW). For the purposes of this application, equivalent weight (EW) is defined to be the weight of the polymer in acid form required to neutralize one equivalent of sodium hydroxide. In the case of a sulfonate polymer where the polymer has a perfluorocarbon backbone and the side chain is —O—$CF_2$—$CF(CF_3)$—O—$CF_2$—$CF_2$—$SO_3H$ (or a salt thereof), the equivalent weight range which corresponds to an IXR of about 8 to about 23 is about 750 EW to about 1500 EW. IXR for this polymer can be related to equivalent weight using the formula: 50 IXR+344=EW. While the same IXR range is used for sulfonate polymers disclosed in U.S. Pat. Nos. 4,358,545 and 4,940,525, e.g., the polymer having the side chain —O—$CF_2CF_2SO_3H$ (or a salt thereof), the equivalent weight is somewhat lower because of the lower molecular weight of the monomer unit containing a cation exchange group. For the preferred IXR range of about 8 to about 23, the corresponding equivalent weight range is about 575 EW to about 1325 EW. IXR for this polymer can be related to equivalent weight using the formula: 50 IXR+178=EW.

The FSA polymers can be prepared as colloidal aqueous dispersions. They may also be in the form of dispersions in other media, examples of which include, but are not limited to, alcohol, water-soluble ethers, such as tetrahydrofuran, mixtures of water-soluble ethers, and combinations thereof. In making the dispersions, the polymer can be used in acid form. U.S. Pat. Nos. 4,433,082, 6,150,426 and WO 03/006537 disclose methods for making of aqueous alcoholic dispersions. After the dispersion is made, concentration and the dispersing liquid composition can be adjusted by methods known in the art.

Aqueous dispersions of the colloid-forming polymeric acids, including FSA polymers, typically have particle sizes as small as possible and an EW as small as possible, so long as a stable colloid is formed.

Aqueous dispersions of FSA polymer are available commercially as Nafion® dispersions, from E.I. du Pont de Nemours and Company (Wilmington, Del.).

4. Preparing Doped Semiconductive Polymers

In one embodiment, the doped semiconductive polymers are formed by oxidative polymerization of the precursor monomer in the presence of at least one FAP. The doped semiconductive polymers are abbreviated hereinafter as "SCP/FAP". The polymerization is generally carried out in a homogeneous aqeuous solution. In another embodiment, the polymerization for obtaining the electrically conducting polymer is carried out in an emulsion of water and an organic solvent. In general, some water is present in order to obtain adequate solubility of the oxidizing agent and/or catalyst. Oxidizing agents such as ammonium persulfate, sodium persulfate, potassium persulfate, and the like, can be used. A catalyst, such as ferric chloride, or ferric sulfate may also be present. The resulting polymerized product will be a solution, dispersion, or emulsion of the doped semiconductive polymer.

In one embodiment, the method of making an aqueous dispersion of the semiconductive polymer doped with FAP includes forming a reaction mixture by combining water, at least one precursor monomer, at least one FAP, and an oxidizing agent, in any order, provided that at least a portion of the FAP is present when at least one of the precursor monomer and the oxidizing agent is added. It will be understood that, in the case of semiconductive copolymers, the term "at least one precursor monomer" encompasses more than one type of monomer.

In one embodiment, the method of making an aqueous dispersion of the doped semiconductive polymer includes forming a reaction mixture by combining water, at least one precursor monomer, at least one FAP, and an oxidizing agent, in any order, provided that at least a portion of the FAP is present when at least one of the precursor monomer and the oxidizing agent is added.

In one embodiment, the method of making the doped semiconductive polymer comprises:
 (a) providing an aqueous solution or dispersion of a FAP;
 (b) adding an oxidizer to the solutions or dispersion of step (a); and
 (c) adding at least one precursor monomer to the mixture of step (b).

In another embodiment, the precursor monomer is added to the aqueous solution or dispersion of the FAP prior to adding the oxidizer. Step (b) above, which is adding oxidizing agent, is then carried out.

In another embodiment, a mixture of water and the precursor monomer is formed, in a concentration typically in the range of about 0.5% by weight to about 4.0% by weight total precursor monomer. This precursor monomer mixture is added to the aqueous solution or dispersion of the FAP, and steps (b) above which is adding oxidizing agent is carried out.

In another embodiment, the aqueous polymerization mixture may include a polymerization catalyst, such as ferric sulfate, ferric chloride, and the like. The catalyst is added before the last step. In another embodiment, a catalyst is added together with an oxidizing agent.

In one embodiment, the polymerization is carried out in the presence of co-dispersing liquids which are miscible with water. Examples of suitable co-dispersing liquids include, but are not limited to ethers, alcohols, alcohol ethers, cyclic ethers, ketones, nitriles, sulfoxides, amides, and combinations thereof. In one embodiment, the co-dispersing liquid is an alcohol. In one embodiment, the co-dispersing liquid is an organic solvent selected from n-propanol, isopropanol, t-butanol, dimethylacetamide, dimethylformamide, N-methylpyrrolidone, and mixtures thereof. In general, the amount of co-dispersing liquid should be less than about 60% by volume. In one embodiment, the amount of co-dispersing liquid is less than about 30% by volume. In one embodiment, the amount of co-dispersing liquid is between 5 and 50% by volume. The use of a co-dispersing liquid in the polymerization significantly reduces particle size and improves filterability of the dispersions. In addition, buffer materials obtained by this process show an increased viscosity and films prepared from these dispersions are of high quality.

The co-dispersing liquid can be added to the reaction mixture at any point in the process.

In one embodiment, the polymerization is carried out in the presence of a co-acid which is a Brøonsted acid. The acid can be an inorganic acid, such as HCl, sulfuric acid, and the like, or an organic acid, such as acetic acid or p-toluenesulfonic acid. Alternatively, the acid can be a water soluble polymeric acid such as poly(styrenesulfonic acid), poly(2-acrylamido-2-methyl-1-propanesulfonic acid, or the like, or a second fluorinated acid polymer, as described above. Combinations of acids can be used.

The co-acid can be added to the reaction mixture at any point in the process prior to the addition of either the oxidizer or the precursor monomer, whichever is added last. In one embodiment, the co-acid is added before both the precursor monomers and the fluorinated acid polymer, and the oxidizer is added last. In one embodiment the co-acid is added prior to the addition of the precursor monomers, followed by the addition of the fluorinated acid polymer, and the oxidizer is added last.

In one embodiment, the polymerization is carried out in the presence of both a co-dispersing liquid and a co-acid.

In the method of making the doped semiconductive polymer, the molar ratio of oxidizer to total precursor monomer is generally in the range of 0.1 to 3.0; and in one embodiment is 0.4 to 1.5. The molar ratio of FAP to total precursor monomer is generally in the range of 0.2 to 10. In one embodiment, the ratio is in the range of 1 to 5. The overall solid content is generally in the range of about 0.5% to 12% in weight percentage; and in one embodiment of about 2% to 6%. The reaction temperature is generally in the range of about 4° C. to 50° C.; in one embodiment about 20° C. to 35° C. The molar ratio of optional co-acid to precursor monomer is about 0.05 to 4. The addition time of the oxidizer influences particle size and viscosity. Thus, the particle size can be reduced by slowing down the addition speed. In parallel, the viscosity is increased by slowing down the addition speed. The reaction time is generally in the range of about 1 to about 30 hours.

(a) pH Treatment

As synthesized, the aqueous dispersions of the doped semiconductive polymers generally have a very low pH. When the semiconductive polymer is doped with a FAP, it has been found that the pH can be adjusted to higher values, without adversely affecting the properties in devices. In one embodiment, the pH of the dispersion can be adjusted to about 1.5 to about 4. In one embodiment, the pH is adjusted to between 2 and 3. It has been found that the pH can be adjusted using known techniques, for example, ion exchange or by titration with an aqueous basic solution.

In one embodiment, the as-formed aqueous dispersion of FAP-doped semiconductive polymer is contacted with at least one ion exchange resin under conditions suitable to remove any remaining decomposed species, side reaction products, and unreacted monomers, and to adjust pH, thus producing a stable, aqueous dispersion with a desired pH. In one embodiment, the as-formed doped semiconductive polymer dispersion is contacted with a first ion exchange resin and a second ion exchange resin, in any order. The as-formed doped semiconductive polymer dispersion can be treated with both the first and second ion exchange resins simultaneously, or it can be treated sequentially with one and then the other. In one embodiment, the two doped semiconductive polymers are combined as-synthesized, and then treated with one or more ion exchange resins.

Ion exchange is a reversible chemical reaction wherein an ion in a fluid medium (such as an aqueous dispersion) is exchanged for a similarly charged ion attached to an immobile solid particle that is insoluble in the fluid medium. The term "ion exchange resin" is used herein to refer to all such substances. The resin is rendered insoluble due to the crosslinked nature of the polymeric support to which the ion exchanging groups are attached. Ion exchange resins are classified as cation exchangers or anion exchangers. Cation exchangers have positively charged mobile ions available for exchange, typically protons or metal ions such as sodium ions. Anion exchangers have exchangeable ions which are negatively charged, typically hydroxide ions.

In one embodiment, the first ion exchange resin is a cation, acid exchange resin which can be in protonic or metal ion, typically sodium ion, form. The second ion exchange resin is a basic, anion exchange resin. Both acidic, cation including proton exchange resins and basic, anion exchange resins are contemplated for use in the practice of the invention. In one embodiment, the acidic, cation exchange resin is an inorganic acid, cation exchange resin, such as a sulfonic acid cation exchange resin. Sulfonic acid cation exchange resins contemplated for use in the practice of the invention include, for example, sulfonated styrene-divinylbenzene copolymers, sulfonated crosslinked styrene polymers, phenol-formaldehyde-sulfonic acid resins, benzene-formaldehyde-sulfonic acid resins, and mixtures thereof. In another embodiment, the acidic, cation exchange resin is an organic acid, cation exchange resin, such as carboxylic acid, acrylic or phosphorous cation exchange resin. In addition, mixtures of different cation exchange resins can be used.

In another embodiment, the basic, anionic exchange resin is a tertiary amine anion exchange resin. Tertiary amine anion exchange resins contemplated for use in the practice of the invention include, for example, tertiary-aminated styrene-divinylbenzene copolymers, tertiary-aminated crosslinked styrene polymers, tertiary-aminated phenol-formaldehyde resins, tertiary-aminated benzene-formaldehyde resins, and mixtures thereof. In a further embodiment, the basic, anionic exchange resin is a quaternary amine anion exchange resin, or mixtures of these and other exchange resins.

The first and second ion exchange resins may contact the as-formed aqueous dispersion either simultaneously, or consecutively. For example, in one embodiment both resins are added simultaneously to an as-formed aqueous dispersion of an electrically conducting polymer, and allowed to remain in contact with the dispersion for at least about 1 hour, e.g., about 2 hours to about 20 hours. The ion exchange resins can then be removed from the dispersion by filtration. The size of the filter is chosen so that the relatively large ion exchange resin particles will be removed while the smaller dispersion particles will pass through. Without wishing to be bound by theory, it is believed that the ion exchange resins quench polymerization and effectively remove ionic and non-ionic impurities and most of unreacted monomer from the as-formed aqueous dispersion. Moreover, the basic, anion exchange and/or acidic, cation exchange resins renders the acidic sites more basic, resulting in increased pH of the dispersion. In general, about one to five grams of ion exchange resin is used per gram of semiconductive polymer composition.

In many cases, the basic ion exchange resin can be used to adjust the pH to the desired level. In some cases, the pH can be further adjusted with an aqueous basic solution such as a solution of sodium hydroxide, ammonium hydroxide, tetramethylammonium hydroxide, or the like.

5. Preparing High Workfunction Transparent Conductors

The new transparent conductors can be formed by first blending the conductive nanoparticles with the FAP or the SCP/FAP. This can be accomplished by adding an aqueous dispersion of the conductive nanoparticles to an aqueous dispersion of the FAP or the SCP/FAP. In one embodiment, the composition is further treated using sonication or microfluidization to ensure mixing of the components.

In one embodiment, one or both of the components are isolated in solid form. The solid material can be redispersed in water or in an aqueous solution or dispersion of the other component. For example, conductive nanoparticle solids can be dispersed in an aqueous solution or dispersion of a semiconductive polymer doped with an FAP.

The solid transparent conductor can then be formed using any liquid deposition technique. Liquid deposition methods are well known. Continuous liquid deposition techniques, include but are not limited to, spin coating, gravure coating, curtain coating, dip coating, slot-die coating, spray coating, and continuous nozzle coating. Discontinuous liquid deposition techniques include, but are not limited to, ink jet printing, gravure printing, and screen printing. The conductor can be in the form of a continuous or patterned layer.

6. Electronic Devices

In another embodiment of the invention, there are provided electronic devices comprising at least one electroactive layer positioned between two electrical contact layers, wherein the device further includes the new transparent conductor. The term "electroactive" when referring to a layer or material is intended to mean a layer or material that exhibits electronic or electro-radiative properties. An electroactive layer material may emit radiation or exhibit a change in concentration of electron-hole pairs when receiving radiation in the applications, for example photovoltaic cells. In another embodiment of the invention, there are provided electronic devices where high workfunction transparent conductors function as electrode of drain, source and drain in field-effect transistor.

Figure 2:
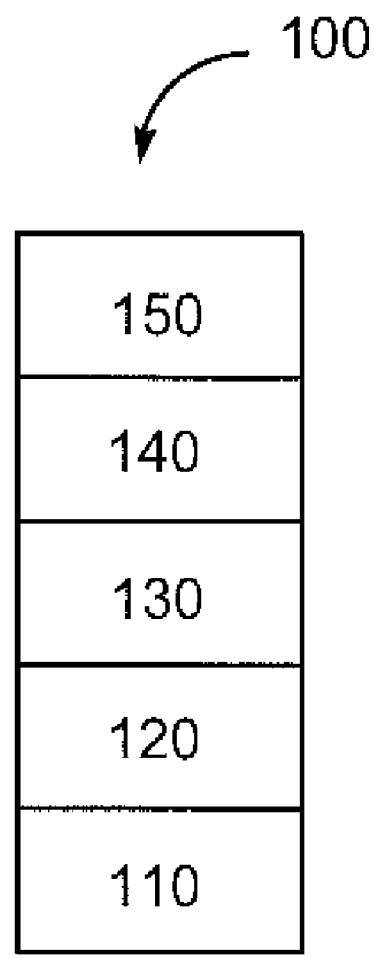
FIG. 2 is a schematic diagram of an organic electronic device.

As shown in FIG. 2, one embodiment of a device, 100, has an anode layer 110, an optional buffer layer 120, an electroactive layer 130, and a cathode layer 150. Adjacent to the cathode layer 150 is an optional electron-injection/transport layer 140.

The new transparent conductor has particular utility as the anode 110. In one embodiment, the transparent conductor is formed by liquid deposition methods. In one embodiment, the deposited transparent conductor films are heat-treated to coalesce the films.

The device may include a support or substrate (not shown) that can be adjacent to the anode layer 110 or the cathode layer 150. Most frequently, the support is adjacent the anode layer 110. The support can be flexible or rigid, organic or inorganic. Examples of support materials include, but are not limited to, glass, ceramic, metal, and plastic films.

The term "buffer layer" or "buffer material" is intended to mean electrically conductive or semiconductive materials and may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device. Buffer materials may be polymers, oligomers, or small molecules, and may be in the form of solutions, dispersions, suspensions, emulsions, colloidal mixtures, or other compositions. In one embodiment, the buffer layer comprises hole transport material. Examples of hole transport materials for layer 120 have been summarized for example, in Kirk-Othmer Encyclopedia of Chemical Technology, Fourth Edition, Vol. 18, p. 837-860, 1996, by Y. Wang. Both hole transporting molecules and polymers can be used. Commonly used hole transporting molecules include, but are not limited to: 4,4',4"-tris(N,N-diphenyl-amino)-triphenylamine (TDATA); 4,4',4"-tris(N-3-methylphenyl-N-phenyl-amino)-triphenylamine (MT-DATA); N,N'-diphenyl-N,N'-bis(3-methylphenyl)-[1,1'-biphenyl]-4,4'-diamine (TPD); 1,1-bis[(di-4-tolylamino)phenyl]cyclohexane (TAPC); N,N'-bis(4-methylphenyl)-N,N'-bis(4-ethylphenyl)-[1,1'-(3,3'-dimethyl)biphenyl]-4,4'-diamine (ETPD); tetrakis-(3-methylphenyl)-N,N,N',N'-2,5-phenylenediamine (PDA); α-phenyl-4-N,N-diphenylaminostyrene (TPS); p-(diethylamino)benzaldehyde diphenylhydrazone (DEH); triphenylamine (TPA); bis[4-(N,N-diethylamino)-2-methylphenyl](4-methylphenyl)methane (MPMP); 1-phenyl-3-[p-(diethylamino)styryl]-5-[p-(diethylamino)phenyl]pyrazoline (PPR or DEASP); 1,2-trans-bis(9H-carbazol-9-yl)cyclobutane (DCZB); N,N,N',N'-tetrakis(4-methylphenyl)-(1,1'-biphenyl)-4,4'-diamine (TTB); N,N'-bis(naphthalen-1-yl)-N,N'-bis-(phenyl)benzidine (α-NPB); and porphyrinic compounds, such as copper phthalocyanine. Commonly used hole transporting polymers include, but are not limited to, poly(9,9,-dioctylfluorene-co-N-(4-butylphenyl)diphenylaminer), and the like, polyvinylcarbazole, (phenylmethyl)polysilane, poly(dioxythiophenes), polyanilines, and polypyrroles. It is also possible to obtain hole transporting polymers by doping hole transporting molecules such as those mentioned above into polymers such as polystyrene and polycarbonate.

Depending upon the application of the device, the electroactive layer 130 can be a light-emitting layer that is activated by an applied voltage (such as in a light-emitting diode or light-emitting electrochemical cell), a layer of material that responds to radiant energy and generates a signal with or without an applied bias voltage (such as in a photodetector). In one embodiment, the electroactive material is an organic electroluminescent ("EL") material. Any EL material can be used in the devices, including, but not limited to, small molecule organic fluorescent compounds, fluorescent and phosphorescent metal complexes, conjugated polymers, and mixtures thereof. Examples of fluorescent compounds include, but are not limited to, pyrene, perylene, rubrene, coumarin, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly(phenylenevinylenes), polyfluorenes, poly(spirobifluorenes), polythiophenes, poly(p-phenylenes), copolymers thereof, and mixtures thereof.

Optional layer 140 can function both to facilitate electron injection/transport, and can also serve as a confinement layer to prevent quenching reactions at layer interfaces. More specifically, layer 140 may promote electron mobility and reduce the likelihood of a quenching reaction if layers 130 and 150 would otherwise be in direct contact. Examples of materials for optional layer 140 include, but are not limited to, metal chelated oxinoid compounds, such as bis(2-methyl-8-quinolinato)(para-phenyl-phenolato)aluminum(III) (BAlQ), tetra(8-hydroxyquinolato)zirconium (ZrQ), and tris(8-hydroxyquinolato)aluminum ($Alq_3$); azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole)benzene (TPBI); quinoxaline derivatives such as 2,3-bis(4-fluorophenyl)quinoxaline; phenanthroline derivatives such as 9,10-diphenylphenanthroline (DPA) and 2,9-dimethyl-4,7-diphenyl-1,10-phenanthroline (DDPA); and any one or more combinations thereof. Alternatively, optional layer 140 may be inorganic and comprise BaO, LiF, $Li_2O$, or the like.

The cathode layer 150 is an electrode that is particularly efficient for injecting electrons or negative charge carriers. The cathode layer 150 can be any metal or nonmetal having a lower work function than the first electrical contact layer (in this case, the anode layer 110).

Materials for the cathode layer can be selected from alkali metals of Group 1 (e.g., Li, Na, K, Rb, Cs), the Group 2 metals (e.g., Mg, Ca, Ba, or the like), the Group 12 metals, the lanthanides (e.g., Ce, Sm, Eu, or the like), and the actinides (e.g., Th, U, or the like). Materials such as aluminum, indium, yttrium, and combinations thereof, may also be used. Specific non-limiting examples of materials for the cathode layer 150 include, but are not limited to, barium, lithium, cerium, cesium, europium, rubidium, yttrium, magnesium, samarium, and alloys and combinations thereof.

The cathode layer 150 is usually formed by a chemical or physical vapor deposition process. In some embodiments, the cathode layer will be patterned, as discussed above in reference to the anode layer 110.

Other layers in the device can be made of any materials which are known to be useful in such layers upon consideration of the function to be served by such layers.

In some embodiments, an encapsulation layer (not shown) is deposited over the contact layer 150 to prevent entry of undesirable components, such as water and oxygen, into the device 100. Such components can have a deleterious effect on the organic layer 130. In one embodiment, the encapsulation layer is a barrier layer or film. In one embodiment, the encapsulation layer is a glass lid.

It is understood that the device 100 may comprise additional layers though such layers are not shown in FIG. 2. Other layers that are known in the art or otherwise may be used. In addition, any of the above-described layers may comprise two or more sub-layers or may form a laminar structure. Alternatively, some or all of anode layer 110 the optional buffer layer 120, the electron transport layer 140, cathode layer 150, and other layers may be treated, especially surface treated, to increase charge carrier transport efficiency or other physical properties of the devices. The choice of materials for each of the component layers is preferably determined by balancing the goals of providing a device with high device efficiency with device operational lifetime considerations, fabrication time and complexity factors and other considerations appreciated by persons skilled in the art. It will be appreciated that determining optimal components, component configurations, and compositional identities would be routine to those of ordinary skill of in the art.

In various embodiments, the different layers have the following ranges of thicknesses: anode 110, 10-2000 Å, in one embodiment 50-500 Å; optional buffer layer 120, 50-2000 Å, in one embodiment 200-1000 Å; photoactive layer 130, 10-2000 Å, in one embodiment 100-1000 Å; optional electron transport layer 140, 50-2000 Å, in one embodiment 100-1000 Å; cathode 150, 200-10000 Å, in one embodiment 300-5000 Å. The location of the electron-hole recombination zone in the device, and thus the emission spectrum of the device, can be affected by the relative thickness of each layer. Thus the thickness of the electron-transport layer should be chosen so that the electron-hole recombination zone is in the light-emitting layer. The desired ratio of layer thicknesses will depend on the exact nature of the materials used.

In operation, a voltage from an appropriate power supply (not depicted) is applied to the device 100. Current therefore passes across the layers of the device 100. Electrons enter the organic polymer layer, releasing photons. In some OLEDs, called active matrix OLED displays, individual deposits of photoactive organic films may be independently excited by the passage of current, leading to individual pixels of light emission. In some OLEDs, called passive matrix OLED displays, deposits of photoactive organic films may be excited by rows and columns of electrical contact layers.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

As used herein, the term "layer" is used interchangeably with the term "film" and refers to a coating covering a desired area. The meaning of the term is not limited by considerations of device or component size. The area can be as large as an entire device or as small as a specific functional area such as the actual visual display, or as small as a single sub-pixel. Layers and films can be formed by any conventional deposition technique, including vapor deposition, liquid deposition (continuous and discontinuous techniques), and thermal transfer. Continuous deposition techniques, include but are not limited to, spin coating, gravure coating, curtain coating, dip coating, slot-die coating, spray coating, and continuous nozzle coating. Discontinuous deposition techniques include, but are not limited to, ink jet printing, gravure printing, and screen printing.

The term "work function" is intended to mean the minimum energy needed to remove an electron from a material to a point at infinite distance away from the surface.

Group numbers corresponding to columns within the periodic table of the elements use the "New Notation" convention as seen in the CRC Handbook of Chemistry and Physics, 81$^{st}$ Edition (2000), where the groups are numbered from left to right as 1-18.

Also, use of "a" or "an" are employed to describe elements and components of the invention. This is done merely for convenience and to give a general sense of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

EXAMPLES

Example 1

This example illustrates preparation of an aqueous carbon nanotube ("CNT") dispersion, and work function of the film spin-coated from the dispersion:

In this example, dispersing CNT in water was accomplished using Triton-X-100 as a dispersing agent. Triton X-100 is a trade mark for octylphenoxy polyethoxy ethanol. It is a non-ionic surfactant and has no influence in affecting Wf of CNT. A stock solution was made by dissolving 1.035 g Triton X-100 in 98.9922 g deionized water, which amounts to 1.05% (w/w) in water. CNT used in this example is L0200 single wall CNT (Laser/raw grade) purchased from CNI at Houston, Tex., USA. 0.0709 g CNT were placed in a small glass jug to which 8.5802 g of the Triton X-100 solution and 25.5112 g de-ionized water were added. The mixture was subjected to sonication for 15 minutes continuously using a Branson Sonifier Model 450 having power set at #3. The glass jug was immersed in ice water contained in a tray to remove heat produced from intense cavitation. The CNT formed a smooth, stable dispersion without any sign of sedimentation for many weeks.

The dispersion was spin-coated to form a film on a substrate for ultraviolet photoelectron spectroscopy for measurement of work function (Wf). Wf energy level is usually determined from second electron cut-off with respect to the position of vacuum level using He I (21.22 eV) radiation. Wf of the film was measured to be 4.5 eV to 4.6 eV, which is very low for effective injection of holes to the light emitting material layer.

Example 2

This example illustrates preparation of an aqueous dispersion of CNT with Nafion® having enhanced Wf of CNT. Nafion® is a trade name for poly(perfluoroethylene sulfonic acid) from E.I. du Pont de Nemours and Company, Wilmington, Del.:

L0200 single wall CNT (Laser/raw grade) in Example 1 was used in this Example. Nafion® used for dispersing CNT is DE1020. A stock dispersion of the Nafion® was prepared first by mixing 19.7753 g DE1020 with 162.119 g deionized water and 18.0151 g n-propanol. The resulting dispersion contained 1.13% Nafion® polymer. 32.5063 g of the dispersion were mixed with 0.0688 g CNT in a glass jug. The mixture was then subjected to sonication for 15 minutes continuously using a Branson Sonifier Model 450 having power set at #3. The glass jug was immersed in ice water contained in a tray to remove heat produced from intense cavitation. The CNT formed a smooth, stable dispersion without any sign of sedimentation for many weeks.

The dispersion was spin-coated to form transparent film on a substrate for measurement of work function (Wf) by Ultraviolet Photoelectron Spectroscopy. Wf energy level is usually determined from second electron cut-off with respect to the position of vacuum level using He I (21.22 eV) radiation. Wf of the film was measured to be 6.2 eV. The Wf is much higher than that (4.5 eV to 4.6 eV) of CNT as illustrated in Example 1.

Example 3

This example illustrates preparation of an aqueous dispersion of CNT with Nafion® and conductivity of CNT/Nafion® film CNT used in this example is HIPco CE608, also purchased from CNI (Carbon Nanotechnologies, Inc.) at Houston, Tex., USA. CE608 contains 3-4% residual catalyst. Nafion® used for dispersing CNT is DE1021. A stock dispersion of the Nafion® was prepared first by mixing 6.0263 g DE1021 with 151.097 g deionized water and 16.797 g n-propanol. The resulting dispersion contained 0.39% Nafion® polymer. 34.9968 g of the dispersion were mixed with 0.0707 g CNT in a glass jug. The mixture was then subjected to sonication for 15 minutes continuously using a Branson Sonifier Model 450 having power set at #3. The glass jug was immersed in ice water contained in a tray to remove heat produced from intense cavitation. The CNT formed a smooth, stable dispersion without any sign of sedimentation for many weeks.

A couple of drops of the dispersion were placed on a microscope slide to form a thin, transparent film. The thin film was painted with a room temperature silver paste to form two parallel lines as electrodes for measurement of resistance. The resistance was converted to conductivity by taking a thickness of the film, separating the two electrodes along the length of the electrodes. Conductivity was determined to be 140 S/cm at room temperature. The conductivity is very close to that of indium/tin oxide film.

Example 4

This example illustrates preparation of electrically conducting poly(3,4, ethylenedioxythiophene) complexed with Nafion® for forming a top layer on a CNT film. A 12.0% (w/w) Nafion® with an EW of 1050 is made using a procedure similar to the procedure in U.S. Pat. No. 6,150,426, Example 1, Part 2, except that the temperature is approximately 270° C.

In a 2000 mL reaction kettle are put 1088.2 g of 12% solid content aqueous Nafion® (124.36 mmol $SO_3H$ groups) dispersion, 1157 g water, 0.161 g (0.311 mmol) iron(III)sulfate ($Fe_2(SO_4)_3$), and 1787 mL of 37% (w/w) HCl (21.76 mmol). The reaction mixture is stirred for 15 min at 276 RPM using an overhead stirrer fitted with a double-stage-propeller-type blade. Addition of 8.87 g (38.86 mmol) ammonium persulfate ($Na_2S_2O_8$) in 40 mL of water, and 3.31 mL ethylenedioxythiophene (EDT) is started from separate syringes using addition rate of 3.1 mL/h for $(NH_4)_2S_2O_8$/water and 237 mL/h for EDT while continuous stirring at 245 RPM. The addition of EDT is accomplished by placing the monomer in a syringe connected to a Teflon® tube that leads directly into the reaction mixture. The end of the Teflon® tube connecting the $(NH_4)_2S_2O_8$/water solution was placed above the reaction mixture such that the injection involved individual drops falling from the end of the tube. The reaction is stopped 7 hours after the addition of monomer has finished by adding 200 g of each Lewatit MP62WS and Lewatit Monoplus S100 ion-exchange resins, and 250 g of de-ionized water to the reaction mixture and stirring it further for 7 hours at 130 RPM. The ion-exchange resin is finally filtered from the dispersion using Whatman No. 54 filter paper. The pH of the PEDOT-Nafion® dispersion is 3.2 and dried films derived from the dispersion have conductivity of $3.2 \times 10^{-4}$ S/cm at room temperature. UPS has shown that PEDOT-Nafion® has Wf of about 5.4 at that pH, which is much higher than Wf of the CNT film shown in Example 1.

Note that not all of the activities described above in the general description or the examples are required, that a portion of a specific activity may not be required, and that one or more further activities may be performed in addition to those described. Still further, the order in which activities are listed are not necessarily the order in which they are or must be performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features of the invention which are, for clarity, described above and below in the context of separate embodiments, may also be provided in combination in a single embodiment. Conversely, various features of the invention that are, for brevity, described in the context of a single embodiment, may also be provided separately or in any subcombination. Further, references to values stated in ranges include each and every value within that range.

What is claimed is:

1. A transparent conductor having a work function greater than 4.7 eV consisting of conductive nanoparticles and a fluorinated acid polymer, wherein the fluorinated acid polymer has a backbone which is a polyolefin.

2. A transparent conductor of claim 1 wherein the nanoparticles are selected from carbon and metal nanoparticles and combinations thereof.

3. A transparent conductor of claim 2 wherein the nanoparticles are selected from nanotubes, fullerenes, and nanofibers, and combinations thereof.

4. A transparent conductor of claim 1 wherein the fluorinated acid polymer backbone is fluorinated.

5. A transparent conductor of claim 4 wherein the fluorinated acid polymer has fluorinated pendant groups which include ether sulfonate.

6. A transparent conductor of claim 1 wherein the fluorinated acid polymer comprises one or more independently substituted or unsubstituted monomers selected from perfluoroalkyl sulfonate ethers.

7. A transparent conductor having a work function greater than 4.7 eV consisting of conductive nanoparticles, a fluorinated acid polymer of claim 1 and a second polymer, the second polymer consisting of one or more independently substituted or unsubstituted monomers selected from alkenyls, alkynyls, arylenes, and heteroarylenes.

8. A transparent conductor of claim 7 wherein the independently substituted or unsubstituted monomers are selected from fluorene, oxadiazoles, thiadiazoles, benzothiadiazoles, phenylenevinylenes, phenyleneethynylenes, pyridine, diazines, and triazines, including combinations thereof.

9. An electronic device comprising a transparent conductor of claim 1.

10. An electronic device of claim 9 comprising an anode layer, wherein the anode layer comprises the transparent conductor.

11. A transparent conductor of claim 1, wherein the fluorinated acid polymer has Formula (XV)

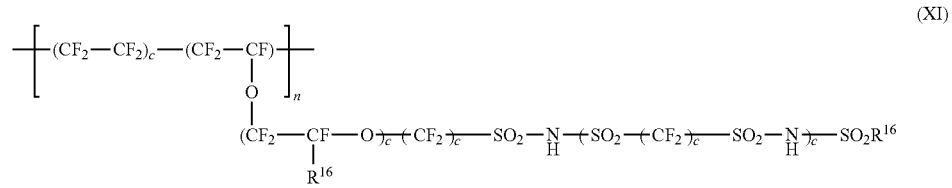

(XI)

where j≧0, k≧0 and 4≧(j+k)≦199, $Q^1$ and $Q^2$ are F or H, $R_f^2$ is F or a perfluoroalkyl radical having 1-10 carbon atoms either unsubstituted or substituted by one or more ether oxygen atoms, h=0 or 1, i=0 to 3, g=0 or 1, and $E^4$ is H or an alkali metal.

* * * * *